(12) United States Patent
Chen et al.

(10) Patent No.: US 12,322,429 B2
(45) Date of Patent: Jun. 3, 2025

(54) EMBEDDED FERROELECTRIC MEMORY CELL

(71) Applicant: Taiwan Semiconductor Manufacturing Company, Ltd., Hsin-Chu (TW)

(72) Inventors: Tzu-Yu Chen, Kaohsiung (TW); Kuo-Chi Tu, Hsin-Chu (TW); Wen-Ting Chu, Kaohsiung (TW); Yong-Shiuan Tsair, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/506,177

(22) Filed: Nov. 10, 2023

(65) Prior Publication Data
US 2024/0071455 A1 Feb. 29, 2024

Related U.S. Application Data

(60) Continuation of application No. 17/866,946, filed on Jul. 18, 2022, now Pat. No. 11,869,564, which is a
(Continued)

(51) Int. Cl.
*G11C 11/22* (2006.01)
*H10B 51/30* (2023.01)
(Continued)

(52) U.S. Cl.
CPC ........ *G11C 11/2259* (2013.01); *G11C 11/223* (2013.01); *G11C 11/2255* (2013.01);
(Continued)

(58) Field of Classification Search
CPC .............. G11C 11/2259; G11C 11/223; G11C 11/2255; G11C 11/2257
See application file for complete search history.

(56) References Cited

U.S. PATENT DOCUMENTS

| | | | |
|---|---|---|---|
| 5,541,870 A | 7/1996 | Mihara et al. | |
| 6,587,367 B1 * | 7/2003 | Nishimura | G11C 11/22 365/210.11 |

(Continued)

FOREIGN PATENT DOCUMENTS

| | | |
|---|---|---|
| CN | 106298796 A | 1/2017 |
| CN | 106935591 A | 7/2017 |

(Continued)

OTHER PUBLICATIONS

Non-Final Office Action dated May 15, 2020 for U.S. Appl. No. 16/267,668.
(Continued)

*Primary Examiner* — Laura M Menz
(74) *Attorney, Agent, or Firm* — Eschweiler & Potashnik, LLC

(57) ABSTRACT

The present disclosure relates to an integrated chip structure. The integrated chip structure includes a first source/drain region and a second source/drain region disposed within a substrate. A select gate is over the substrate between the first source/drain region and the second source/drain region. A ferroelectric random access memory (FeRAM) device is over the substrate between the select gate and the first source/drain region. A transistor device is disposed on an upper surface of the substrate. The substrate has a recessed surface that is below the upper surface of the substrate and that is laterally separated from the upper surface of the substrate by a boundary isolation structure extending into a trench within the upper surface of the substrate. The FeRAM device is arranged over the recessed surface.

20 Claims, 16 Drawing Sheets

Related U.S. Application Data continuation of application No. 17/177,627, filed on Feb. 17, 2021, now Pat. No. 11,437,084, which is a division of application No. 16/267,668, filed on Feb. 5, 2019, now Pat. No. 10,930,333.

(60) Provisional application No. 62/724,289, filed on Aug. 29, 2018.

(51) Int. Cl.
    *H10B 51/40*     (2023.01)
    *H10D 64/68*     (2025.01)

(52) U.S. Cl.
    CPC .......... *G11C 11/2257* (2013.01); *H10B 51/30* (2023.02); *H10B 51/40* (2023.02); *H10D 64/689* (2025.01)

(56) References Cited

U.S. PATENT DOCUMENTS

| | | | |
|---|---|---|---|
| 6,960,801 B2* | 11/2005 | Lung | H10B 51/30 257/295 |
| 9,852,785 B2* | 12/2017 | Chih | G11C 11/2275 |
| 10,192,605 B2 | 1/2019 | Nicholes et al. | |
| 10,930,333 B2* | 2/2021 | Chen | H10D 64/033 |
| 11,004,867 B2* | 5/2021 | Wu | H10D 30/701 |
| 11,170,836 B1* | 11/2021 | Tang | G11C 11/2257 |
| 11,183,503 B2* | 11/2021 | Chen | H10B 53/10 |
| 11,309,353 B2* | 4/2022 | Goto | H10B 63/30 |
| 11,437,084 B2* | 9/2022 | Chen | G11C 11/2255 |
| 11,869,564 B2* | 1/2024 | Chen | G11C 11/223 |
| 2002/0142488 A1 | 10/2002 | Hong | |
| 2002/0190274 A1* | 12/2002 | Lung | H10D 30/0415 257/E21.663 |
| 2002/0190296 A1 | 12/2002 | Shimada | |
| 2003/0039146 A1 | 2/2003 | Choi | |
| 2005/0090085 A1 | 4/2005 | Lindsay | |
| 2010/0123177 A1 | 5/2010 | Ozaki | |
| 2010/0165736 A1 | 7/2010 | Kwon | |
| 2013/0264620 A1 | 10/2013 | Yu et al. | |
| 2016/0379988 A1 | 12/2016 | Chuang et al. | |
| 2017/0178712 A1* | 6/2017 | Van Houdt | H10D 64/033 |
| 2017/0194344 A1 | 7/2017 | Wu et al. | |
| 2017/0309322 A1 | 10/2017 | Ramaswamy et al. | |
| 2017/0345479 A1* | 11/2017 | Chih | G11C 11/2275 |
| 2019/0237470 A1* | 8/2019 | Mine | H10D 30/63 |
| 2019/0287980 A1* | 9/2019 | Yoo | H10D 64/689 |
| 2019/0355584 A1* | 11/2019 | Yamaguchi | H10B 51/10 |
| 2020/0006359 A1* | 1/2020 | Wu | H01L 21/76224 |
| 2020/0075075 A1* | 3/2020 | Chen | G11C 11/2255 |
| 2020/0357453 A1* | 11/2020 | Slesazeck | G11C 11/2273 |
| 2021/0035992 A1* | 2/2021 | Chen | H10B 53/30 |
| 2021/0174856 A1* | 6/2021 | Chen | H10B 51/30 |
| 2021/0233919 A1* | 7/2021 | Wu | H10B 51/50 |
| 2021/0343731 A1* | 11/2021 | Chen | H10D 1/692 |
| 2021/0343787 A1* | 11/2021 | Goto | H10B 61/22 |
| 2022/0077165 A1* | 3/2022 | Chen | H10D 1/692 |
| 2022/0351769 A1* | 11/2022 | Chen | H10B 53/40 |
| 2022/0366941 A1* | 11/2022 | Chiu | H10B 63/34 |
| 2023/0209836 A1* | 6/2023 | Chang | H10B 51/30 257/295 |
| 2024/0071455 A1* | 2/2024 | Chen | H10D 64/689 |
| 2024/0274207 A1* | 8/2024 | Tanaka | G11C 16/16 |
| 2024/0389342 A1* | 11/2024 | Chang | H10D 64/033 |

FOREIGN PATENT DOCUMENTS

| | | | | |
|---|---|---|---|---|
| CN | 110660804 A | * | 1/2020 | ....... H01L 21/28132 |
| CN | 110875333 A | * | 3/2020 | ........... G11C 11/223 |
| CN | 110660804 B | * | 12/2021 | ....... H01L 21/28132 |
| CN | 115000044 A | * | 9/2022 | ......... G11C 13/0026 |
| CN | 115867038 A | * | 3/2023 | .......... H01L 27/1159 |
| CN | 110875333 B | * | 12/2023 | ........... G11C 11/223 |
| DE | 102019115270 A1 | * | 1/2020 | ....... H01L 21/28132 |
| DE | 102019104255 A1 | * | 3/2020 | ........... G11C 11/223 |
| DE | 102019129279 A1 | * | 2/2021 | ........... G11C 11/221 |
| DE | 102019104255 B4 | * | 3/2023 | ........... G11C 11/223 |
| JP | 06112500 A | * | 4/1994 | |
| JP | H06112498 A | | 4/1994 | |
| JP | H06112500 A | | 4/1994 | |
| JP | 2023098812 A | * | 7/2023 | .......... H01L 27/1159 |
| JP | 2024113993 A | * | 8/2024 | ........ G11C 16/0433 |
| JP | 7617878 B2 | * | 1/2025 | .......... H01L 27/1159 |
| KR | 20100080190 A | | 7/2010 | |
| KR | 20110068769 A | | 6/2011 | |
| TW | 201740544 A | | 11/2017 | |
| TW | 202010102 A | * | 3/2020 | ........... G11C 11/223 |
| TW | 202327056 A | * | 7/2023 | .......... H01L 27/1159 |
| WO | WO-2018186035 A1 | * | 10/2018 | ........... G11C 11/223 |
| WO | WO-2020263338 A1 | * | 12/2020 | ........... G11C 11/223 |

OTHER PUBLICATIONS

Notice of Allowance dated Aug. 26, 2020 for U.S. Appl. No. 16/267,668.

Notice of Allowance dated May 2, 2022 for U.S. Appl. No. 17/177,627.

Notice of Allowance dated Aug. 17, 2023 for U.S. Appl. No. 17/866,946.

* cited by examiner

402 ↘

|  | WL(SG) | SL | BL | CGL |  |
|---|---|---|---|---|---|
| Program | 0-1 V | 0 V | 0 V | $V_{prog}$ | ← 404 |
| Erase | 0 V | $V_{prog}$ | $V_{prog}$ | 0 V | ← 406 |
| Read | 0.5-1.8V | 0.5-$V_{dd}$ | 0 V | 0-$V_{dd}$ | ← 408 |

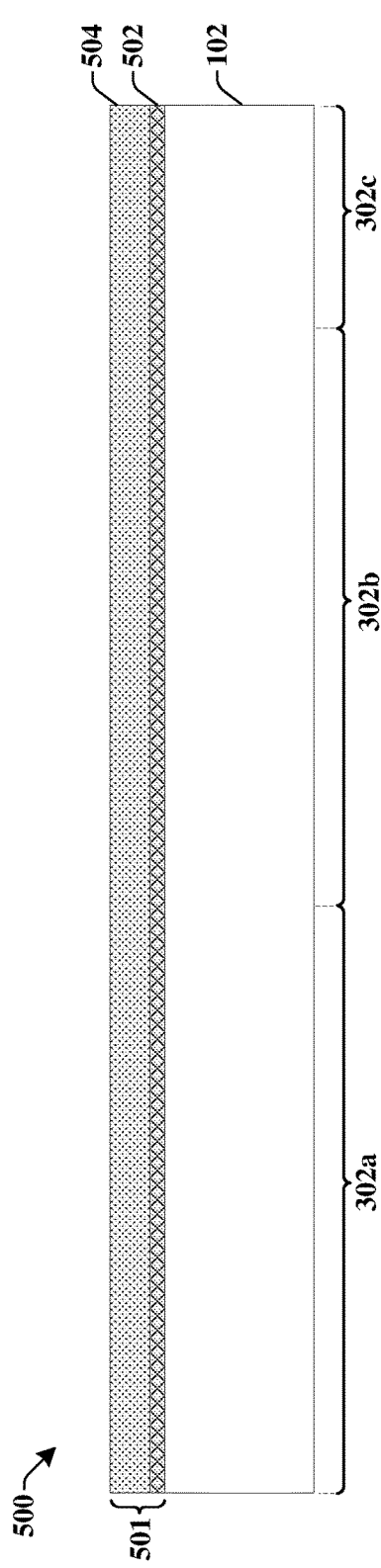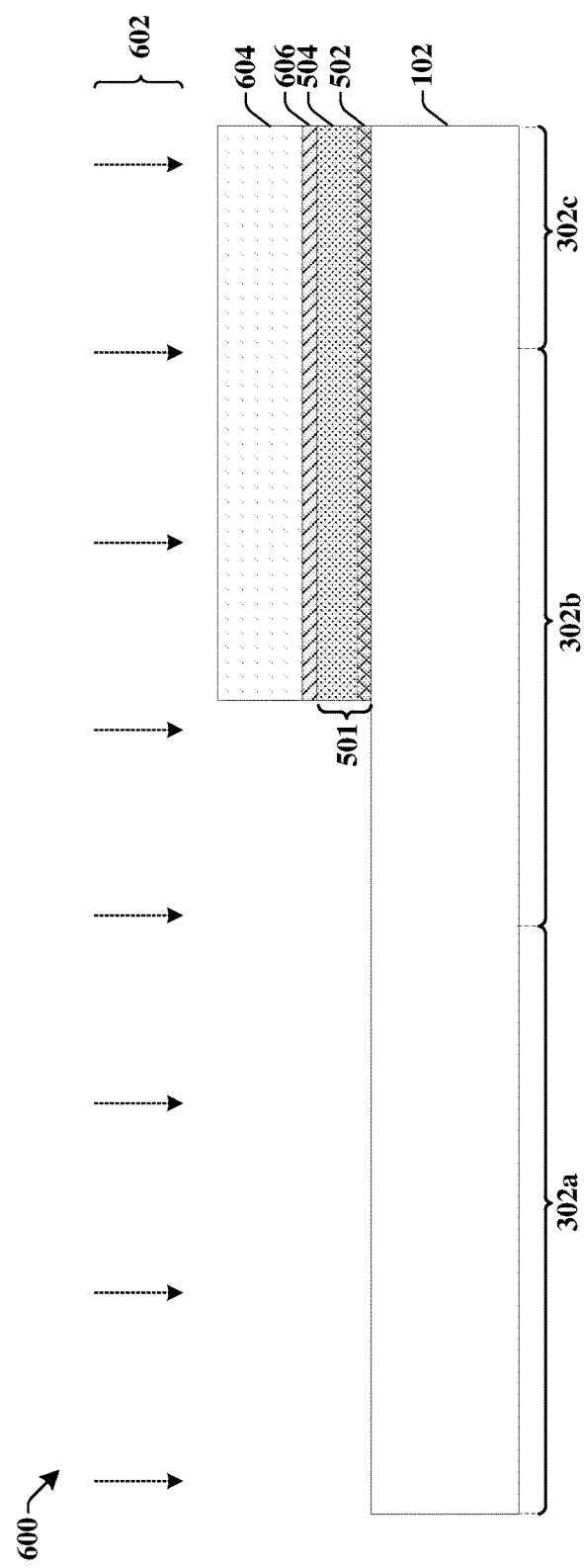
Fig. 5
Fig. 6

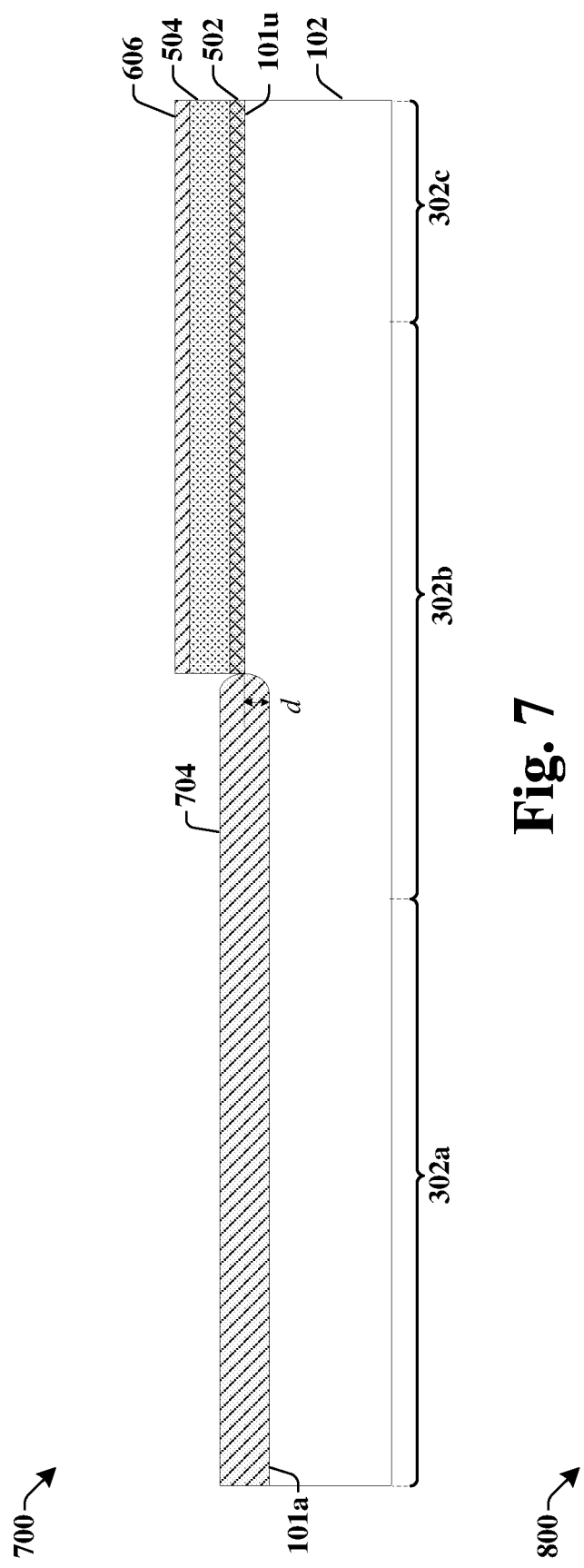
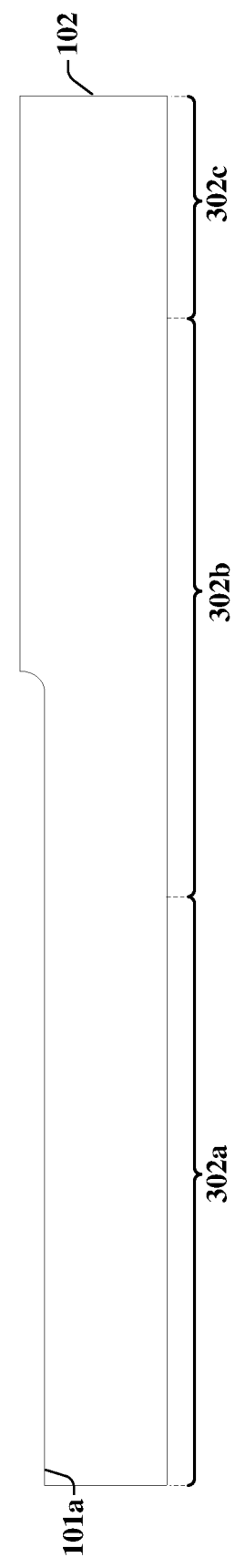
Fig. 7
Fig. 8

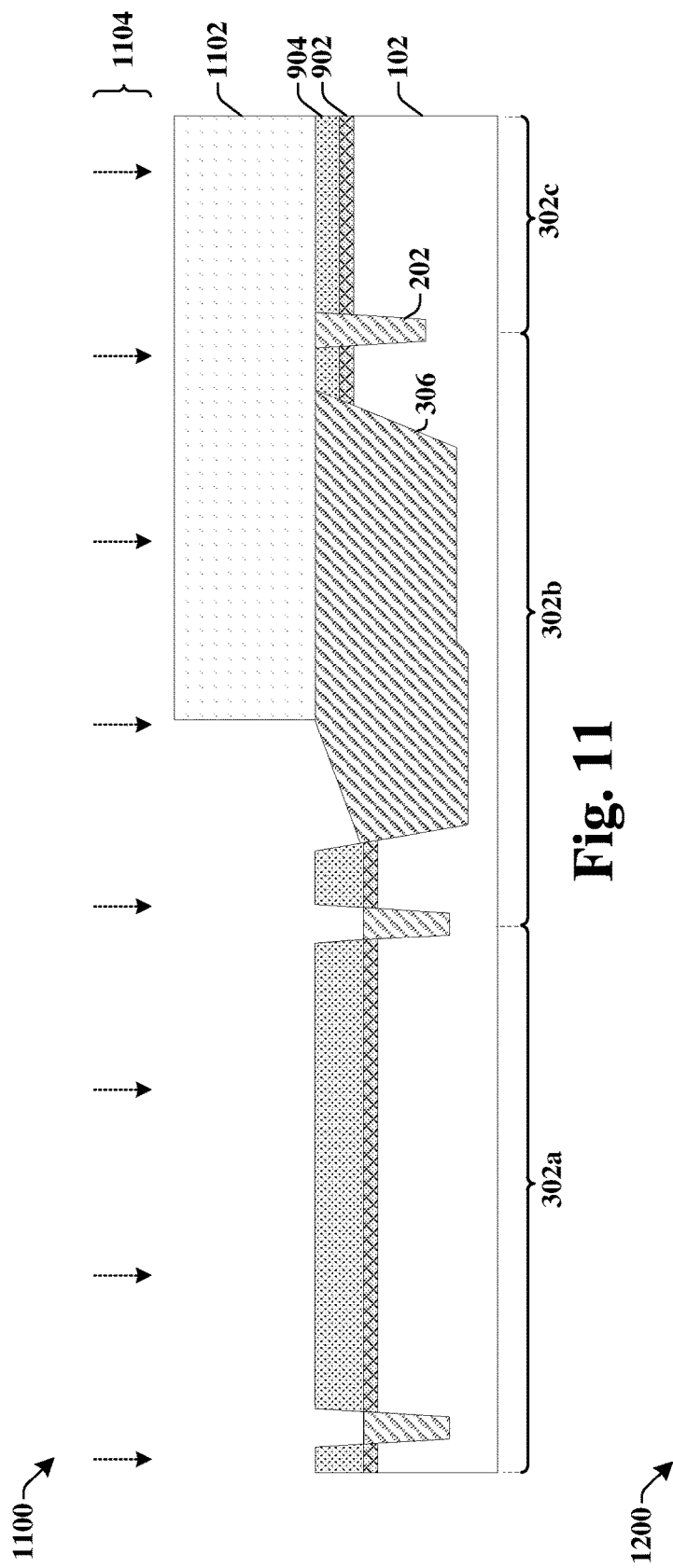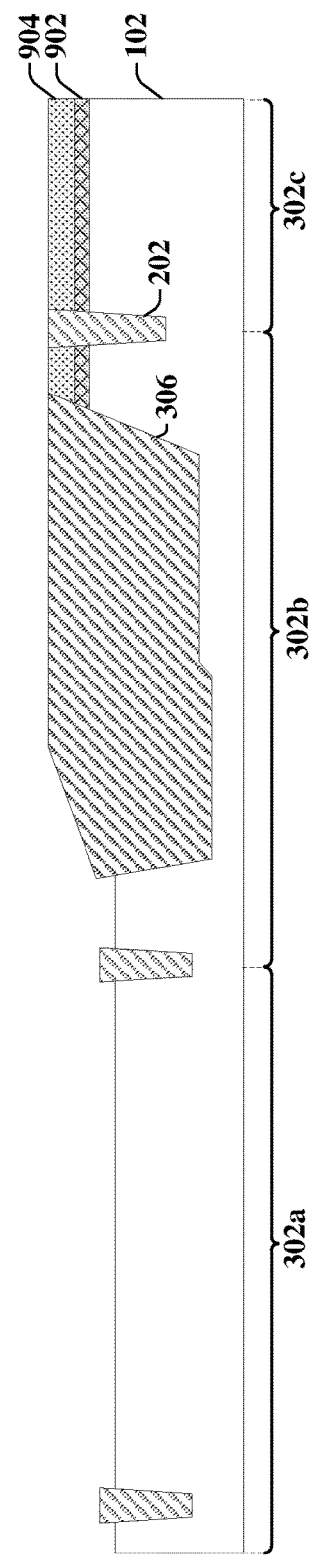
Fig. 11
Fig. 12

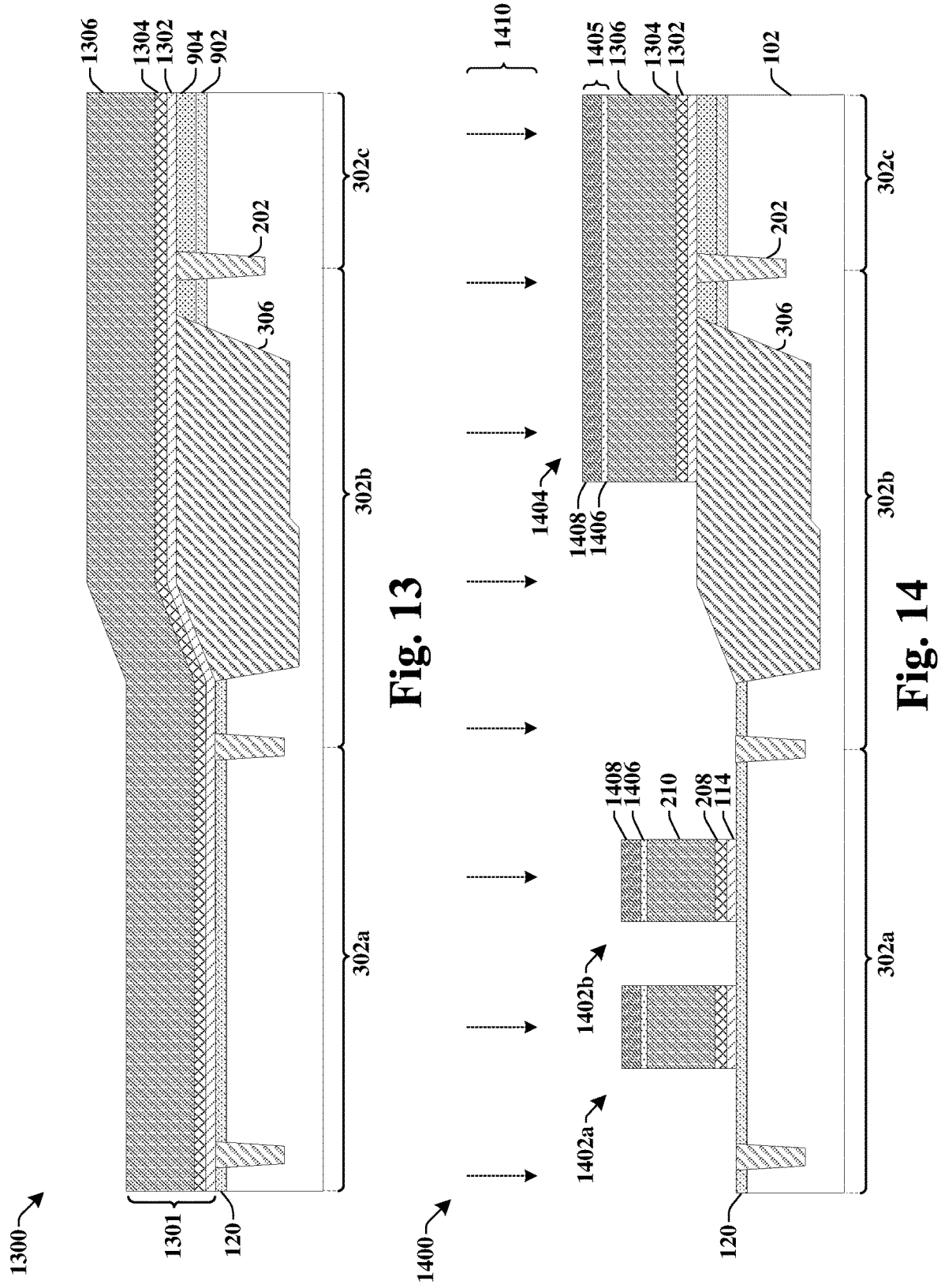

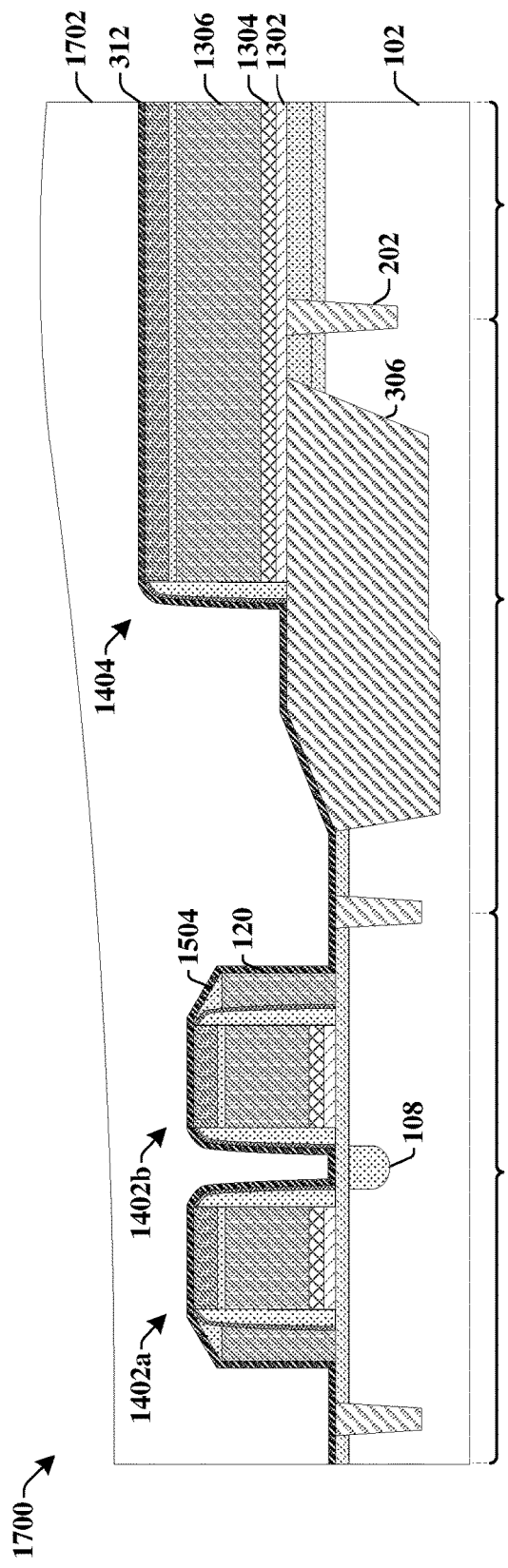
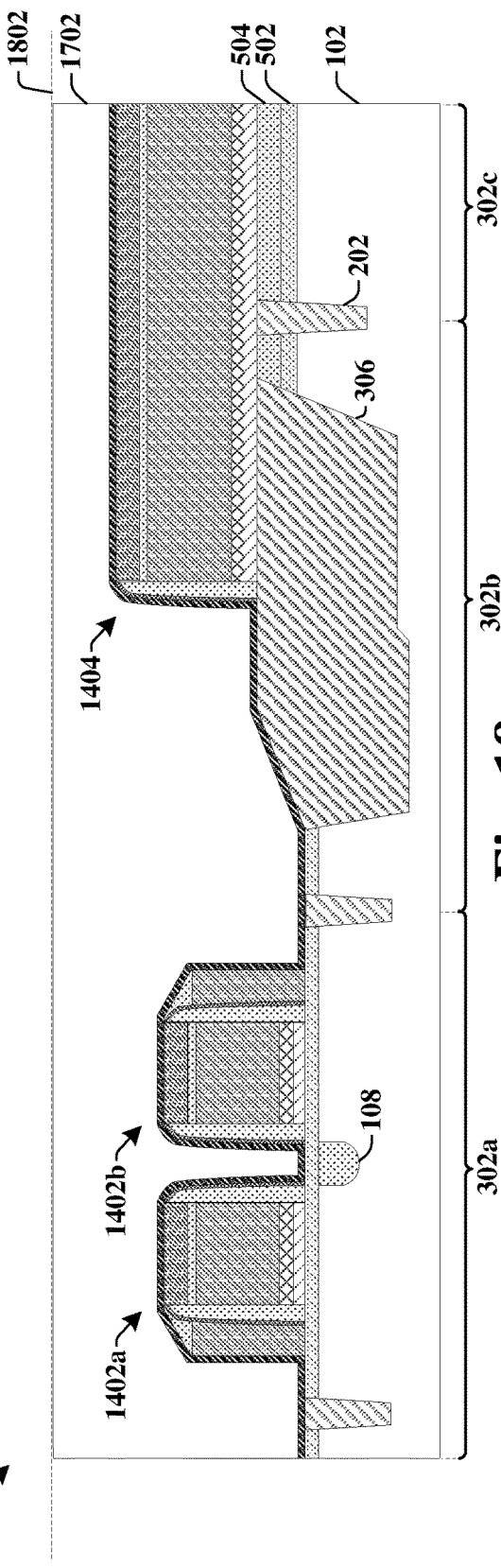
Fig. 17
Fig. 18

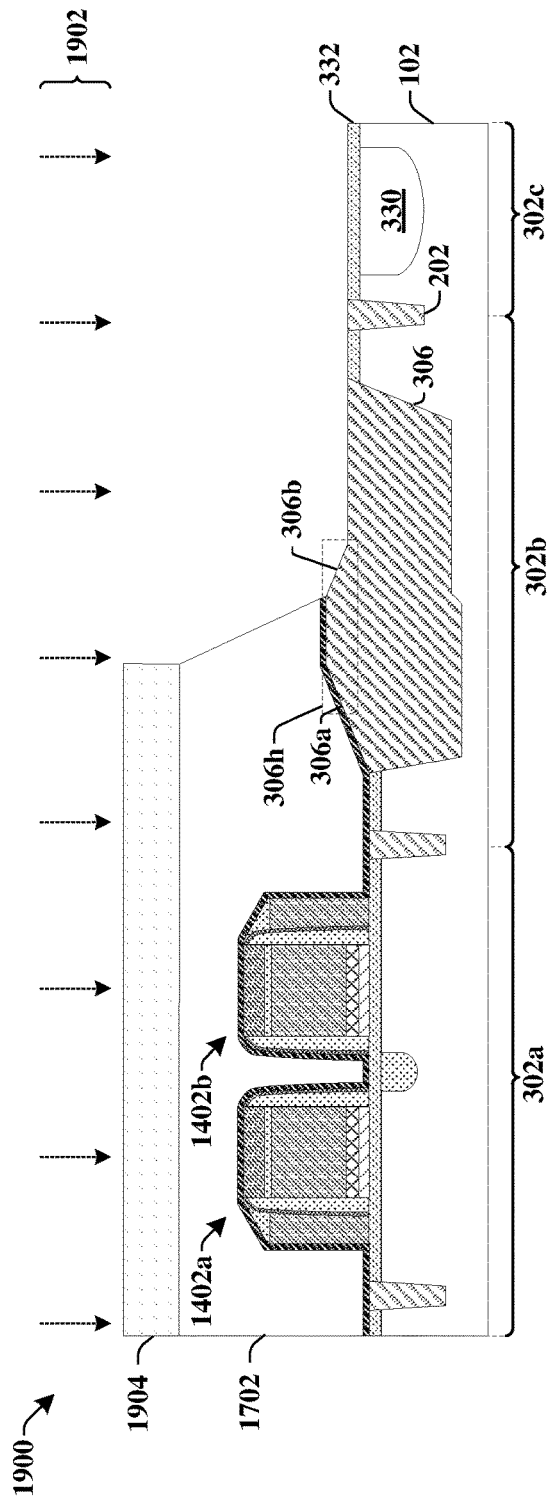
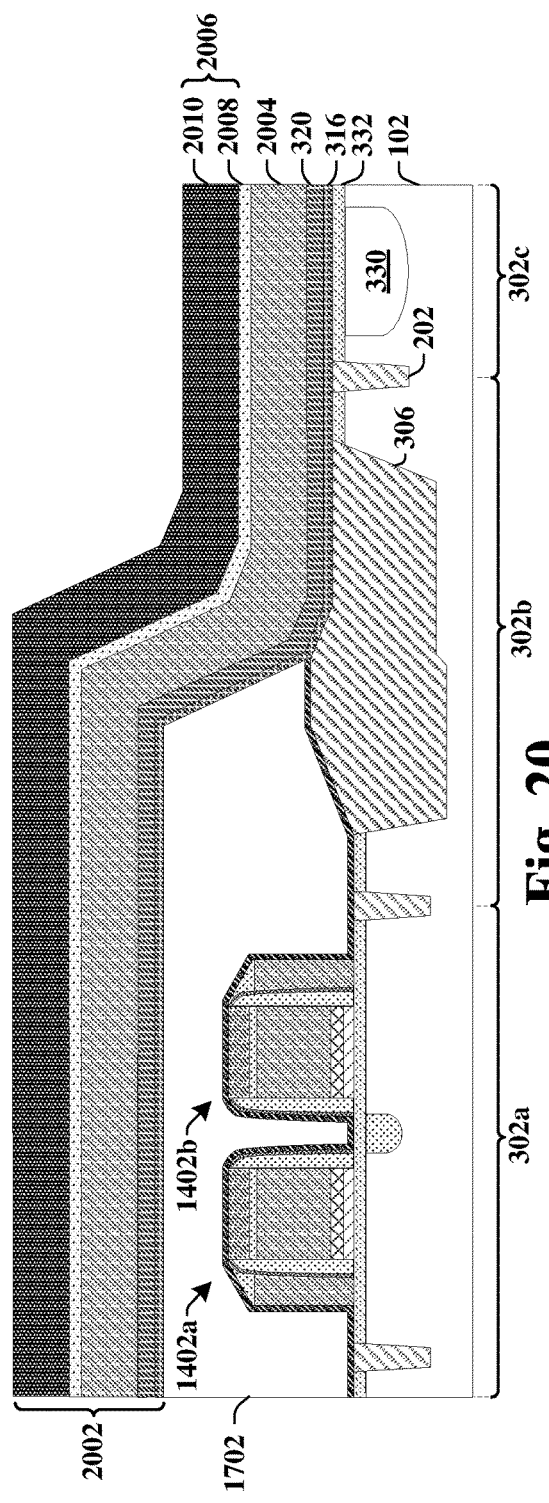
Fig. 19
Fig. 20

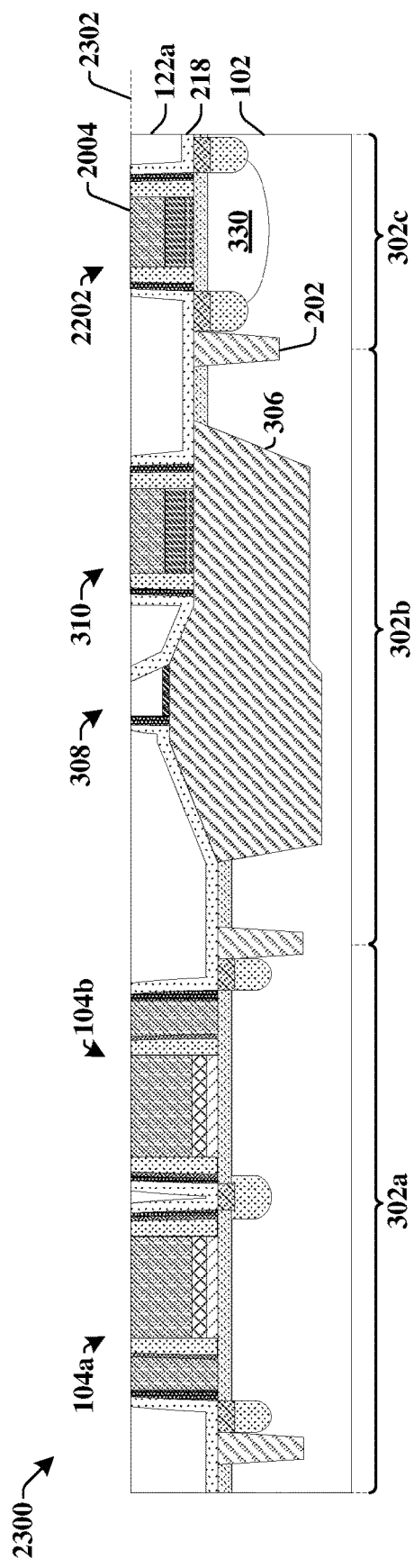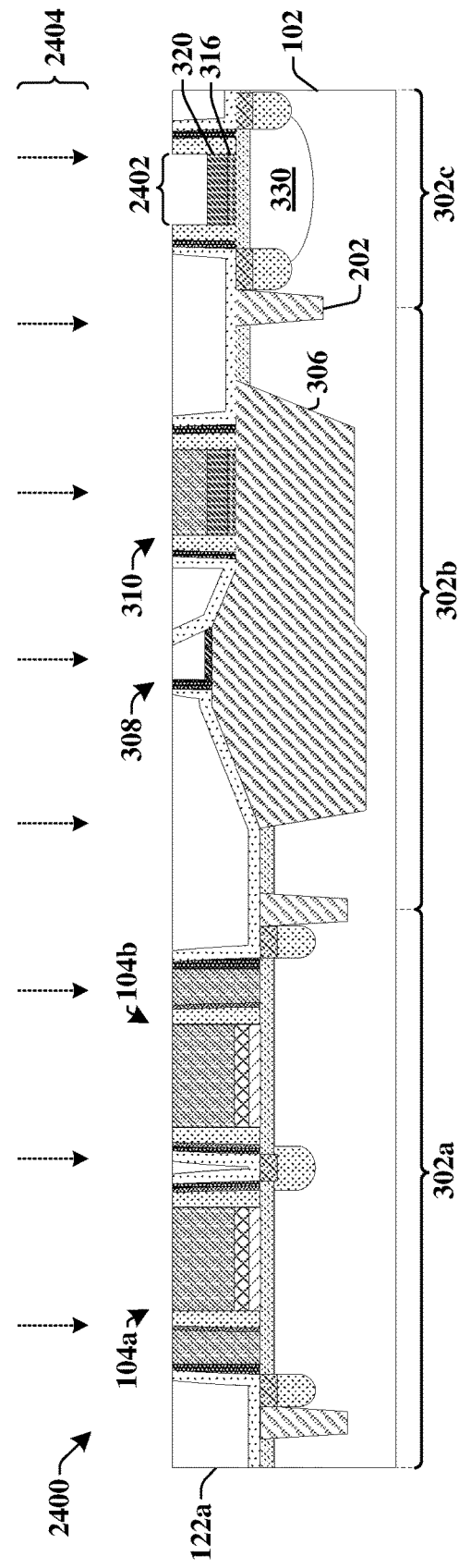
Fig. 23
Fig. 24

EMBEDDED FERROELECTRIC MEMORY CELL

REFERENCE TO RELATED APPLICATIONS

This application is a Continuation of U.S. application Ser. No. 17/866,946, filed on Jul. 18, 2022, which is a Continuation of U.S. application Ser. No. 17/177,627, filed on Feb. 17, 2021 (now U.S. Pat. No. 11,437,084, issued on Sep. 6, 2022), which is a Divisional of U.S. application Ser. No. 16/267,668, filed on Feb. 5, 2019 (now U.S. Pat. No. 10,930,333, issued on Feb. 23, 2021), which claims the benefit of U.S. Provisional Application No. 62/724,289, filed on Aug. 29, 2018. The contents of the above-referenced patent applications are hereby incorporated by reference in their entirety.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-26 illustrate cross-sectional views of some embodiments of a method of forming an integrated chip having an embedded FeRAM cell.

DETAILED DESCRIPTION

Figure 1:
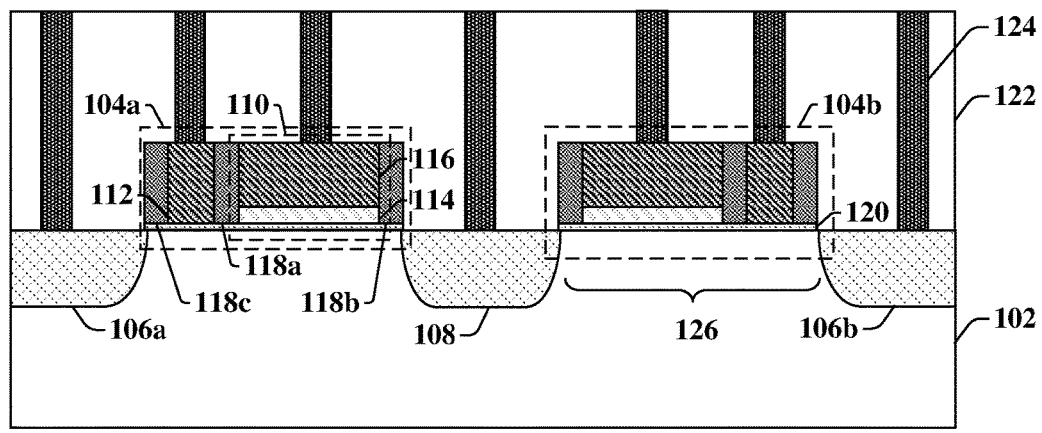
FIG. 1 illustrates a cross-sectional view of some embodiments of a memory structure having a ferroelectric random-access memory (FeRAM) cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embedded memory has become common in modern day integrated chips. Embedded memory is electronic memory devices that are located on a same integrated chip die as logic devices (e.g., a processor or ASIC). By embedding memory devices and logic devices on a same integrated chip die, the conductive interconnects between the memory devices and the logic devices can be shortened, thereby reducing power and/or increasing performance of an integrated chip.

FeRAM (ferroelectric random access memory) devices are a promising candidate for embedded memory applications. FeRAM devices may be integrated in an FeRAM array as plurality of 1T (one transistor) cells. The plurality of 1T cells respectively comprise a channel region laterally disposed between a source region and a drain region. A ferroelectric material is vertically arranged between the channel region and an overlying conductive electrode. The ferroelectric material is able to store a data state (e.g., corresponding to a logic '0' or '1') depending upon charges accumulated within the channel region and/or a bias voltage applied to the conductive electrode.

However, it has been appreciated that unwanted currents may flow in channel regions of unselected 1T FeRAM cells. The unwanted currents can increase a power consumption of an FeRAM array and/or negatively impact read operations of the FeRAM array. It has been further appreciated that the unwanted currents in channel regions of unselected 1T FeRAM cells may have a larger impact on the power consumption and/or read operations of an FeRAM array as a size of the 1T FeRAM cells decreases.

The present disclosure, in some embodiments, relates to an integrated chip having an embedded FeRAM cell. The embedded FeRAM cell comprises a source region and a drain region disposed within a substrate. A select gate is disposed over the substrate between the source region and the drain region, and an FeRAM device is disposed over the substrate between the select gate and the source region. The FeRAM device comprises a ferroelectric layer arranged between the substrate and a conductive electrode. The select gate and/or the conductive electrode are configured to selectively provide access (e.g., read and/or write data) to the FeRAM device. By using a select gate to selectively provide access to the FeRAM device, the memory cell effectively operates as a 1.5 transistor FERAM cell (e.g., an FE RAM cell that is configured to switch provide access to the FeRAM device based upon gate voltages received at more than one conductive electrode), causing a relatively low current to be achieved in channel regions of unselected FeRAM cells and thereby improving the power consumption and/or read operations of an FeRAM array.

FIG. 1 illustrates a cross-sectional view of some embodiments of a memory structure 100 comprising a ferroelectric random-access memory (FeRAM) cell.

The memory structure 100 comprises a plurality of FeRAM cells 104a-104b configured to respectively store a data state (e.g., a logic '0' or '1'). The plurality of FeRAM cells 104a-104b are arranged over a substrate 102 between drain regions 106a-106b and a common source region 108 within the substrate 102. For example, in some embodiments the plurality of FeRAM cells 104a-104b comprise a first FeRAM cell 104a arranged between a first drain region 106a and the common source region 108 and a second FeRAM cell 104b arranged between a second drain region 106b and the common source region 108.

The plurality of FeRAM cells 104a-104b respectively comprise an FeRAM device 110 and a select gate 112. The FeRAM device 110 has a ferroelectric material 114 arranged between the substrate 102 and an overlying conductive electrode 116. The select gate 112 is arranged along a first side of the FeRAM device 110, between the FeRAM device 110 and a closest one of the drain regions 106a-106b.

In some embodiments, a first side of the select gate 112 is laterally separated from the first side of the FeRAM device 110 by way of a first sidewall spacer 118a. In some embodiments, a second sidewall spacer 118b is arranged along a second side of the FeRAM device 110 and a third sidewall spacer 118c is arranged along a second side of the select gate 112. In some embodiments, the first sidewall spacer 118a, the second sidewall spacer 118b, and the third sidewall spacer 118c comprise one or more of the same materials. In some embodiments, the first sidewall spacer 118a, the second sidewall spacer 118b, and the third sidewall spacer 118c comprise one or more different materials.

In some embodiments, the ferroelectric material 114 and the select gate 112 are separated from the substrate 102 by way of an interfacial dielectric layer 120. In some embodiments, the interfacial dielectric layer 120 continuously extends from directly below the ferroelectric material 114 to directly below the select gate 112. An inter-level dielectric (ILD) structure 122 is arranged over the substrate 102 and laterally surrounds the plurality of FeRAM cells 104a-104b. Conductive contacts 124 extend through the ILD structure 122 to contact the drain regions 106a-106b, the common source region 108, the conductive electrode 116, and the select gate 112.

During operation, one or more bias voltages can be applied to the conductive electrode 116 and the select gate 112. The one or more bias voltages cause charge carriers (e.g., electrons and/or holes) to accumulate within a channel region 126 between the drain regions 106a-106b and the common source region 108. The bias voltages and/or charge carriers generate electric fields, which extend through the ferroelectric material 114. The electric fields are configured to change positions of electric dipoles within the ferroelectric material 114 depending on the applied bias voltages and/or charge carriers. If the magnetic polarization of the ferroelectric material 114 has a first polarization, the FeRAM device 110 will digitally store data as a first bit value (e.g., a logical "0"). Alternatively, if the magnetic polarization of the ferroelectric material 114 has a second polarization, the FeRAM device 110 will digitally store data as a second bit value (e.g., a logical "1").

Typically, FeRAM cells may experience a small leakage current within channel regions of unselected FeRAM cells. However, the select gate 112 is configured to reduce the channel current for unselected FeRAM cells, thereby decreasing a power consumption of an FeRAM array. Furthermore, the relatively simple operation of the FeRAM device 110 enables the FeRAM device 110 to be formed by way of a relatively simple fabrication process compared to other commonly used embedded memory types (e.g., such as embedded flash memory, which may utilize an erase gate), thereby allowing the FeRAM device 110 to be formed at a low cost.

Figure 2A:
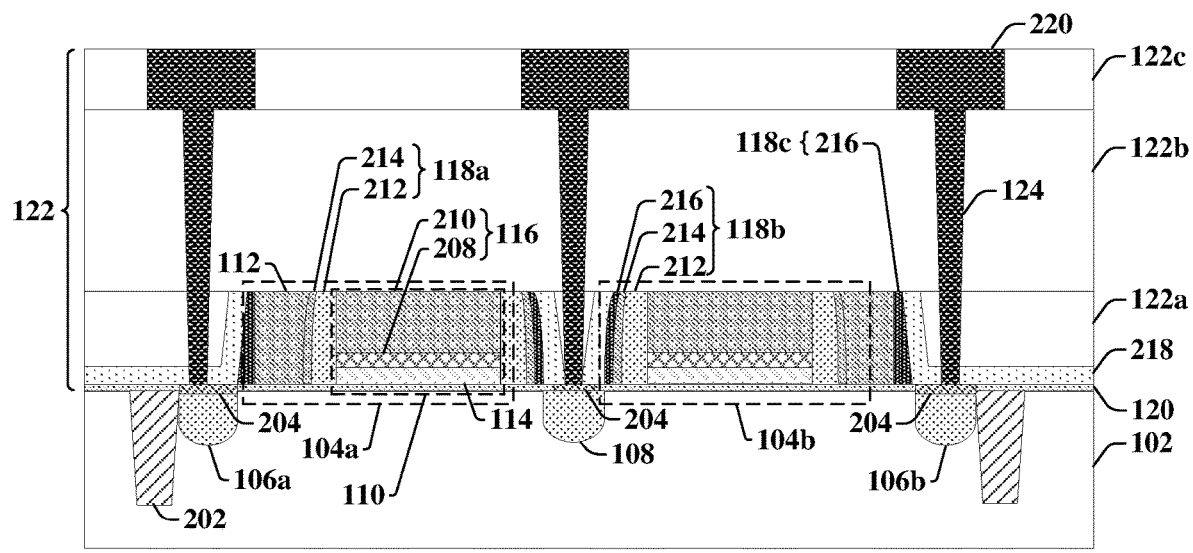
FIG. 2A illustrates a cross-sectional view of some additional embodiments of a memory structure having an FeRAM cell.

FIG. 2A illustrates a cross-sectional view of some additional embodiments of a memory structure 200 comprising an FeRAM cell.

The memory structure 200 comprises a plurality of FeRAM cells 104a-104b arranged over a substrate 102. In some embodiments, isolation structures 202 may be arranged within the substrate 102 on opposing sides of the plurality of FeRAM cells 104a-104b. The isolation structures 202 may comprise one or more dielectric materials arranged within trenches defined by interior surfaces of the substrate 102. In some embodiments, the isolation structures 202 may comprise shallow trench isolation (STI) structures. In some such embodiments, the isolation structures 202 may comprise a same isolation structure continuously extending in a closed loop around a perimeter of the plurality of FeRAM cells 104a-104b.

The plurality of FeRAM cells 104a-104b respectively comprise an FeRAM device 110 and a select gate 112 arranged between drain regions 106a-106b and a common source region 108. In some embodiments, the select gate 112 may comprise a conductive material, such as doped polysilicon, a metal, or the like. In some embodiments, the drain regions 106a-106b and the common source region 108 may have a first doping type that is opposite a second doping type of the substrate 102. In some embodiments, the common source region 108 continuously extends perpendicular to (e.g., into) the plane of the paper between two or more FeRAM cells (not shown) to form a source line. In some embodiments, a silicide layer 204 is arranged over the drain regions 106a-106b and the common source region 108. The silicide layer 204 may comprise nickel, cobalt, or the like.

In some embodiments, the drain regions 106a-106b may have a different doping concentration and/or shape than the common source region 108. For example, in some embodiments, the drain regions 106a-106b may have a lower doping concentration than the common source region 108. The lower doping concentration of the drain regions 106a-106b mitigates gate induced drain leakage (GIDL) current in the FeRAM cells 104a-104b.

The FeRAM device 110 comprises a ferroelectric material 114 and a conductive electrode 116 disposed over the ferroelectric material 114. In some embodiments, the ferroelectric material 114 is separated from the substrate 102 by way of an interfacial dielectric layer 120. In some embodiments, the interfacial dielectric layer 120 has a substantially flat surface between the first FeRAM cell 104a and the second FeRAM cell 104b. In some embodiments, the interfacial dielectric layer 120 may comprise an oxide, a nitride, a carbide, or the like. In some embodiments, the conductive electrode 116 may comprise etch stop layer 208 and a conductive material 210. In various embodiments, the ferroelectric material 114 may comprise silicon doped hafnium oxide (Si-doped $HfO_2$), lead titanate, lead zirconate titanate (PZT), lead lanthanum zirconate titanate, strontium bismuth tantalate (SBT), bismuth lanthanum titanate (BLT), bismuth neodymium titanate (BNT), or the like. In some embodiments, etch stop layer 208 may comprise aluminum, ruthenium, palladium, hafnium, zirconium, titanium, or the like. In some embodiments, the conductive material 210 may comprise polysilicon, aluminum, copper, or the like. In some embodiments, the conductive material 210 may be a same material (e.g., polysilicon) as the select gate 112.

A first sidewall spacer material 212 is arranged along opposing sides of the FeRAM device 110. In some embodiments, the first sidewall spacer material 212 continuously extends to directly contact sidewalls of the conductive material 210, etch stop layer 208, and the ferroelectric material 114. In some embodiments, the first sidewall spacer material 212 may continuously extends to directly contact and completely cover the sidewalls of the conductive material 210, etch stop layer 208, and the ferroelectric material 114. A second sidewall spacer material 214 is separated from the opposing sides of the FeRAM device 110 by way of the first sidewall spacer material 212. The second sidewall spacer material 214 also separates the first sidewall spacer material 212 from the select gate 112. A third sidewall spacer material 216 is arranged along a side of the FeRAM device 110 facing away from a closest select gate 112 and along a side of the select gate 112 facing away from a closest FeRAM device 110.

The first sidewall spacer material 212, the second sidewall spacer material 214, and the third sidewall spacer material 216 have substantially equal heights. In some embodiments, the first sidewall spacer material 212, the second sidewall spacer material 214, and the third sidewall spacer material 216 respectively extend from a first horizontal plane extending along a bottom of the ferroelectric material 114 to a second horizontal plane extending along a top of the conductive material 210. In some embodiments, the first sidewall spacer material 212, the second sidewall spacer material 214, and the third sidewall spacer material 216 comprise different materials. For example, the first sidewall spacer material 212 may comprise a nitride (e.g., silicon nitride), the second sidewall spacer material 214 may comprise an oxide (e.g., silicon oxide), and the third sidewall spacer material 216 may comprise a carbide (e.g., silicon carbide).

A contact etch stop layer (CESL) 218 is arranged over the substrate 102 and along sidewalls of the third sidewall spacer material 216. The CESL 218 laterally separates the third sidewall spacer material 216 from a first inter-level dielectric (ILD) layer 122a laterally surrounding the plurality of FeRAM cells 104a-104b. In some embodiments, the CESL 218 has an uppermost surface that is substantially planar with upper surfaces of the conductive electrode 116, the select gate 112, and the first ILD layer 122a. In some embodiments, the CESL 218 may comprise a carbide (e.g., silicon carbide), a nitride (e.g., silicon nitride), or the like. In some embodiments, the first ILD layer 122a may comprise an oxide (e.g., silicon oxide), borosilicate glass (BSG), phosphosilicate glass (PSG), or the like.

A second ILD layer 122b is arranged over the first ILD layer 122a and an IMD (inter-metal dielectric) layer 122c is arranged over the second ILD layer 122b. In some embodiments, the second ILD layer 122b and/or IMD layer 122c may comprise borophosphosilicate glass (BPSG), borosilicate glass (BSG), phosphosilicate glass (PSG), fluorine doped silicon dioxide, carbon doped silicon dioxide, or the like. Conductive contacts 124 extend from a top of the second ILD layer 122b to the drain regions 106a-106b, the common source region 108, the select gates 112 (not shown), and the conductive electrode 116 (not shown). Conductive interconnect wires 220 are disposed within IMD layer 122c. The conductive interconnect wires 220 are electrically coupled to the conductive contacts 124. In some embodiments, the conductive contacts 124 and/or the conductive interconnect wires 220 may comprise a metal such as tungsten, copper or the like.

In some embodiments, one of the conductive contacts 124 that is directly over the common source region 108 may laterally contact the first ILD layer 122a (e.g., so that the conductive contact is separated from the CESL 218 by the first ILD layer 122a). In other embodiments (not shown), an interface between the one of the conductive contacts 124 that is directly over the common source region 108 and the CESL 218 vertically extends to a horizontal plane extending along a top of the FeRAM devices 110.

Figure 2B:
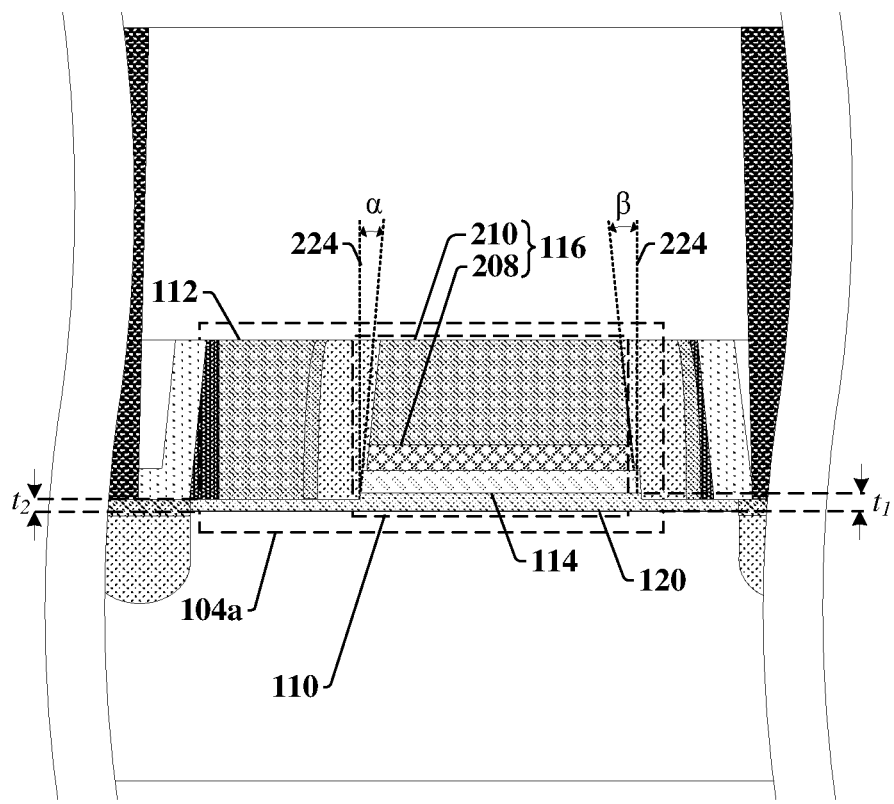
FIG. 2B illustrates a cross-sectional view of some alternative embodiments of an FeRAM cell.

FIG. 2B illustrates a cross-sectional view of some alternative embodiments of an FeRAM cell 222.

The FeRAM cell 222 comprises a ferroelectric material 114 and a conductive electrode 116. In some embodiments, the FeRAM cell 222 may be formed by depositing a layer of conductive material over a layer of ferroelectric material and subsequently patterning the layers of conductive and ferroelectric materials. Such patterning causes widths of the ferroelectric material 114 and the conductive electrode 116 to decrease as a distance from a substrate 102 increases due to a selective etching process that is used to define the FeRAM cell 222. In some embodiments sidewalls of the ferroelectric material 114 and the conductive electrode 116 are angled at one or more non-zero angles with respect to lines 224 that are normal to an upper surface of the substrate 102. For example, in some embodiments, sidewalls of the ferroelectric material 114 are angled at an angle α with respect to a line 224 that is normal to an upper surface of the substrate 102 and sidewalls of the conductive electrode 116 are angled at an angle β with respect to a line 224 that is normal to an upper surface of the substrate 102. In some embodiments, α and β may be substantially equal. In other embodiments, α and β may be different. In some embodiments, α and β may be in a range of approximately 0° and approximately 30°. In some embodiments, α and β may be in a range of between 0° and 30°.

In some embodiments, the selectivity of etchants used to etch the conductive electrode 116 and the ferroelectric material 114 may be different, so that the conductive electrode 116 and the ferroelectric material 114 etch at different rates. The different etching selectivities may cause the etchants to etch the conductive electrode and the ferroelectric material at different lateral etch rates, causing a bottom surface of the conductive electrode 116 to have a smaller width than a top surface of the ferroelectric material 114. The smaller width of the bottom surface of the conductive electrode 116 causes the top surface of the ferroelectric material to continuously extends past opposing sides of the conductive electrode 116 by non-zero distances. In other embodiments, the bottom surface of the conductive electrode 116 may have a width that is substantially equal to a width of the top surface of the ferroelectric material 114.

In some embodiments, an interfacial dielectric layer 120 may have a first thickness $t_1$ directly below the ferroelectric material 114 and a second thickness $t_2$ directly below the select gate 112. In some embodiments, the first thickness $t_1$ is different (e.g., larger) than the second thickness $t_2$. For example, in some embodiments, the first thickness $t_1$ may be between in a range of between approximately 0 nm and approximately 5 nm larger than the second thickness $t_2$. In such embodiments, the first sidewall spacer material 212, the second sidewall spacer material 214, and the third sidewall spacer material 216 respectively extend from below the ferroelectric material 114 to a top of the conductive electrode 116. In other embodiments (not shown), the first thickness $t_1$ is substantially equal to the second thickness $t_2$. In yet other embodiments (not shown), the interfacial dielectric layer 120 may have a first thickness directly below the ferroelectric material 114, a second thickness directly below the select gate 112, and a third thickness outside of the select gate 112 and ferroelectric material 114. In such embodiments, the first thickness may be larger than the second thickness (e.g., by between approximately 0 nm and approximately 5 nm), and the second thickness may be larger than the third thickness (e.g., by between approximately 0 nm and approximately 5 nm).

Figure 3:
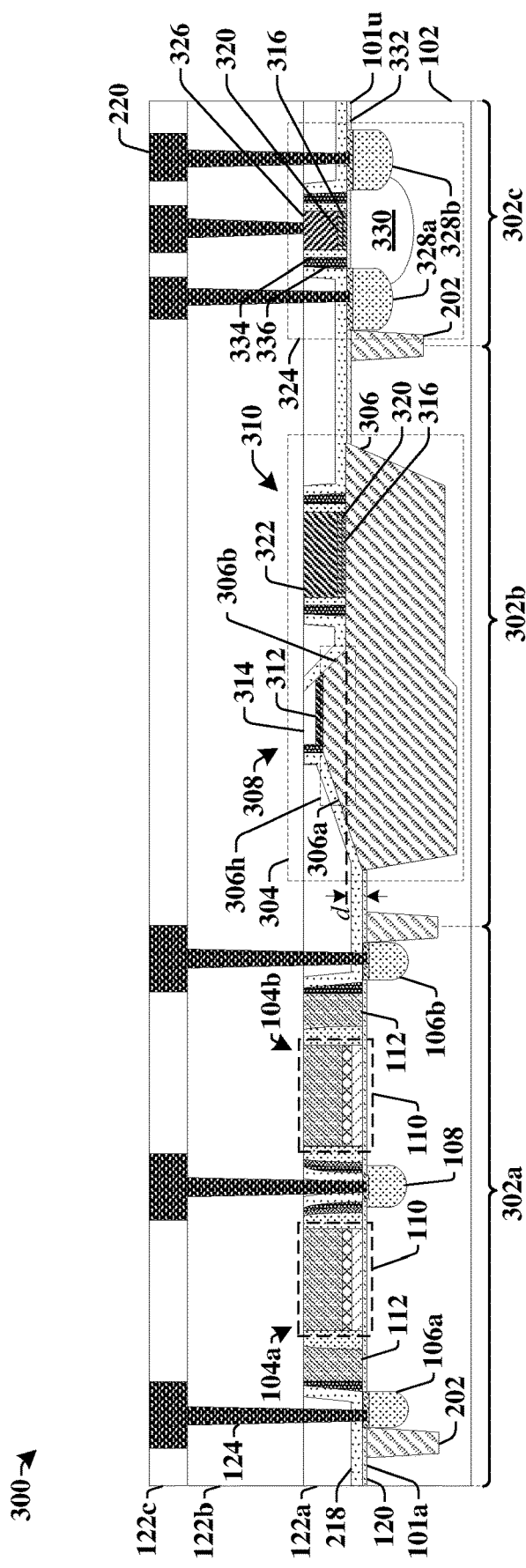
FIG. 3 illustrates a cross-sectional view of some embodiments of an integrated chip having an embedded FeRAM cell.

FIG. 3 illustrates a cross-sectional view of some additional embodiments of an integrated chip 300 comprising an embedded FeRAM cell.

The integrated chip 300 comprises a substrate 102 having an embedded memory region 302a separated from a logic region 302c by way of a boundary region 302b. In some embodiments, the substrate 102 may have a recessed surface 101a within the embedded memory region 302a. The recessed surface 101a is recessed below an upper surface 101u of the substrate 102 by a non-zero distance d. In some embodiments, isolation structures 202 may be arranged in trenches in the substrate 102 within the embedded memory region 302a and the logic region 302c.

A plurality of FeRAM cells 104a-104b are arranged over the recessed surface 101a. The plurality of FeRAM cells 104a-104b respectively comprise an FeRAM device 110 and a select gate 112. In some embodiments, the FeRAM device 110 has a height that is in a range of between approximately 500 angstroms and approximately 1000 angstroms. In other embodiments, the FeRAM device 110 has a height that is in a range of between approximately 600 angstroms and approximately 900 angstroms. In some embodiments, the non-zero distance d is in a range of between approximately 100 angstroms and approximately 200 angstroms. The height of the FeRAM device 110 and the non-zero distance d increase a chemical mechanical planarization (CMP) window of the FeRAM device 110 during formation of transistor devices (e.g., high-k metal gate transistor devices) within the logic region 302c.

In some embodiments, the boundary region 302b comprises a boundary structure 304 arranged over the substrate 102 and separating the embedded memory region 302a from the logic region 302c. The boundary structure 304 comprises a boundary isolation structure 306, a dummy memory structure 308, and a dummy logic structure 310.

The boundary isolation structure 306 extends into a trench disposed between the upper surface 101u of the substrate 102 and the recessed surface 101a of the substrate 102. The boundary isolation structure 306 may comprise one or more dielectric materials (e.g., an oxide, a nitride, a carbide, and/or the like) disposed within the trench. The boundary isolation structure 306 comprises a first slanted sidewall 306a and a second slanted sidewall 306b that define a hillock 306h along a top of the boundary isolation structure 306. In some embodiments, the hillock 306h may be closer to the embedded memory region 302a than to the logic region 302c. In some embodiments, the first slanted sidewall 306a is slanted at a shallower angle than the second slanted sidewall 306b.

The dummy memory structure 308 overlies the hillock 306h. The dummy memory structure 308 comprises a lower dummy memory layer 312 and an upper dummy memory layer 314 over the lower dummy memory layer 312. In some embodiments, lower dummy memory layer 312 may comprise, for example, silicon oxide, silicon nitride, silicon oxynitride, silicon carbide, polysilicon, aluminum copper, tantalum, tantalum nitride, titanium nitride, or the like. The lower dummy memory layer 312 is a different material than the upper dummy memory layer 314, and may be or comprise, for example, silicon oxide, silicon nitride, or the like. In some embodiments, the lower dummy memory layer 312 comprises silicon oxide and the upper dummy memory layer 314 comprises polysilicon. In some embodiments, the dummy memory structure 308 has a substantially vertical sidewall facing the embedded memory region 302a and a slanted sidewall facing the logic region 302c. In some embodiments, a third sidewall spacer material 216 is arranged between the substantially vertical sidewall and a CESL 218, while the slanted sidewall directly contacts the CESL 218.

The dummy logic structure 310 overlies the boundary isolation structure 306, between the dummy memory structure 308 and the logic region 302c. The dummy logic structure 310 comprises a gate dielectric layer 316 and an overlying upper dummy logic layer 322. In some embodiments, an etch stop layer 320 may be arranged between the gate dielectric layer 316 and the upper dummy logic layer 322. In some embodiments, the upper dummy logic layer 322 may comprise polysilicon or some other suitable material.

The logic region 302c comprises a transistor device 324. The transistor device 324 has a gate electrode 326 arranged over the upper surface 101u of the substrate 102 between a second source region 328a and a second drain region 328b. In some embodiments, the second source region 328a and the second drain region 328b may contact a well region 330 underlying the gate electrode 326 and having the doping type different than the second source region 328a and the second drain region 328b. In some embodiments, the gate electrode 326 is separated from the substrate 102 by a gate dielectric layer 316. In some embodiments, an etch stop layer 320 may be arranged between the gate dielectric layer 316 and the gate electrode 326. In some embodiments, an interfacial dielectric layer 332 may be arranged between the gate dielectric layer 316 and the substrate 102.

In some embodiments, the gate electrode 326 may comprise a metal gate electrode (e.g., comprising aluminum, ruthenium, palladium, or the like) and the gate dielectric layer 316 may comprise a high-k dielectric (e.g., comprising aluminum oxide, hafnium oxide, or the like). In some embodiments, the etch stop layer 320 may comprise tantalum nitride, or the like. In some embodiments, the interfacial dielectric layer 332 may comprise an oxide (e.g., silicon oxide or the like). In other embodiments (not shown), the gate electrode 326 may comprise polysilicon and the gate dielectric layer 316 may comprise an oxide or high-k dielectric (e.g., silicon dioxide). In such embodiments, the etch stop layer 320 may be omitted.

A first logic sidewall spacer material 334 is arranged along opposing sides of the transistor device 324. In some embodiments, a second logic sidewall spacer material 336 is arranged along opposing sides of the transistor device 324. In some embodiments, the first logic sidewall spacer material 334 may comprise a different dielectric material (e.g., silicon nitride) than the second logic sidewall spacer material 336 (e.g., silicon oxide). In some embodiments, the first logic sidewall spacer material 334 may comprise a same material as a first sidewall spacer material (212 of FIG. 2A) within the embedded memory region 302a and the second logic sidewall spacer material 336 may comprise a same material as a third sidewall spacer material (216 of FIG. 2A).

Figure 4A:
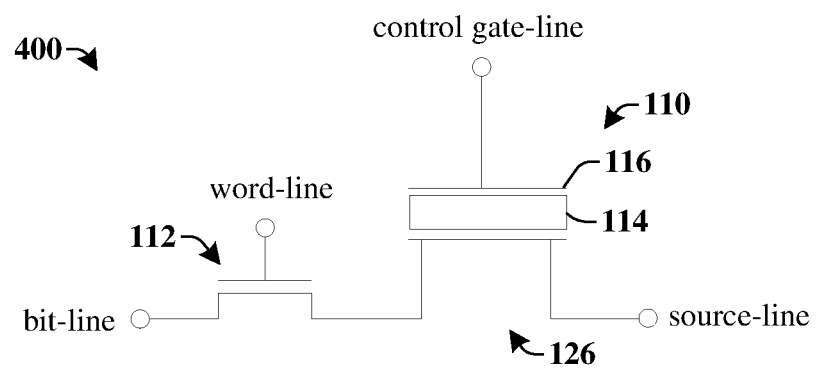
FIG. 4A illustrates a schematic diagram of some embodiments of the disclosed FeRAM cell.

FIG. 4A illustrates a schematic diagram of a disclosed FeRAM cell 400.

The FeRAM cell 400 comprises a select gate 112 and an FeRAM device 110 arranged between a bit-line (e.g., corresponding to first drain region 106a of FIG. 1) and a source-line (e.g., corresponding to common source region 108 of FIG. 1). The FeRAM device 110 comprises a ferroelectric material 114 arranged between a channel region 126 and a conductive electrode 116. The select gate 112 is coupled to a word-line, while the conductive electrode 116 is coupled to a control gate-line that is configured to be biased independently from the word-line.

Figures 4B, 4C:
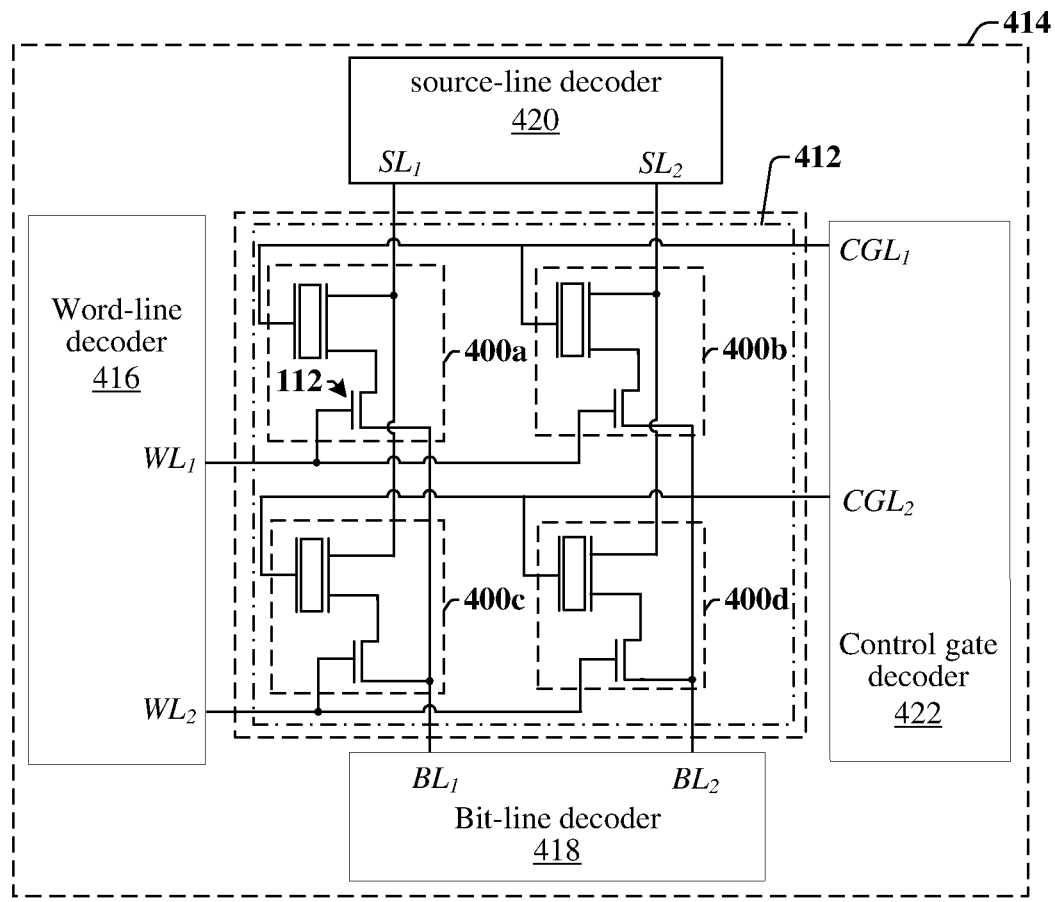
FIG. 4B illustrates a graph showing some embodiments of exemplary operating conditions of the disclosed FeRAM cell.
FIG. 4C illustrates a schematic diagram of some embodiments of a memory structure having a plurality of FeRAM cells.

FIG. 4B illustrates a graph 402 showing some embodiments of exemplary operating conditions of the disclosed FeRAM cell 400 of FIG. 4A. It will be appreciated that data states are written to an FeRAM cell based upon an applied voltage. For example, the application of a positive voltage across the FeRAM cell writes a first data state to the FeRAM cell, while the application of a negative voltage across the FeRAM cell writes a second data state to the FeRAM cell.

As shown in line 404 of graph 402, to write a first data state (e.g., corresponding to a logical '1') to an FeRAM device (110 of FIG. 4A), the source-line (SL) and the bit-line (BL) are held at approximately 0 V, a word-line (WL) coupled to the select gate (112 of FIG. 4A) is held at between approximately 0 V and approximately 1V, and the control-gate-line (CGL) is held at a non-zero bias voltage $V_{prog}$. As shown in line 406 of graph 402, to write a second data state (e.g., corresponding to a logical '0') to an FeRAM device (110 of FIG. 4A), the source-line (SL) and the bit-line (BL) are held at non-zero bias voltages $V_{prog}$, and the word-line (WL) and the control-gate-line (CGL) are held at approximately 0 V.

Polarization of the ferroelectric material (114 of FIG. 4A) is able to change the threshold voltage of the FeRAM device (110 of FIG. 4A), such that a data state can be read from the FeRAM device (110 of FIG. 4A) by detecting a change in the threshold voltage of the FeRAM device (110 of FIG. 4A). As shown in line 408 of graph 402, to read a data state from the FeRAM device (110 of FIG. 4A) the bit-line (BL) is held at approximately 0 V, the word-line (WL) is held at between approximately 0.5 V and 1.8 V, the source-line (SL) is held at between approximately 0.5 V and $V_{dd}$, and the control-gate-line (CGL) is held at between approximately 0 V and $V_{dd}$.

It will be appreciated that the value of the non-zero bias voltage $V_{prog}$ may vary depending on the ferroelectric material of the FeRAM device (110 of FIG. 4A). For example, an FeRAM device having a ferroelectric material of hafnium oxide may use a different non-zero bias voltage $V_{prog}$ (e.g., $V_{prog}$ is approximately equal to 6 V) than a FeRAM device having a ferroelectric material of PZT.

FIG. 4C illustrates a memory structure 410 comprising a plurality of FeRAM cells 400a-400d.

The plurality of FeRAM cells 400a-400d are arranged within a memory array 412 in rows and/or columns. The plurality of FeRAM cells 400a-400d within a row are operably coupled to word-lines $WL_1$-$WL_2$ by way of a select gate 112 and to control-gate-lines $CGL_1$-$CGL_2$. The plurality of FeRAM cells 400a-400d within a column are operably coupled to bit-lines $BL_1$-$BL_2$ and source-lines $SL_1$-$SL_2$.

The word-lines $WL_1$-$WL_2$, the bit-lines $BL_1$-$BL_2$, the source-lines $SL_1$-$SL_2$, and the control-gate-lines $CGL_1$-$CGL_2$ are coupled to control circuitry 414. In some embodiments, the control circuitry 414 comprises a word-line decoder 416 coupled to the word-lines $WL_1$-$WL_2$, a bit-line decoder 418 coupled to the bit-lines $BL_1$-$BL_2$, a source-line decoder 420 coupled to the source-lines $SL_1$-$SL_2$, and a control gate decoder 422 coupled to the control-gate-lines $CGL_1$-$CGL_2$. The word-line decoder 416 is configured to selectively apply a bias voltage to one of the word-lines $WL_1$-$WL_2$. Concurrently, the bit-line decoder 418 is configured to selectively apply a bias voltage to one of the bit-lines $BL_1$-$BL_2$, the source-line decoder 420 is configured to selectively apply a bias voltage to one of the source-lines $SL_1$-$SL_2$, and the control gate decoder 422 is configured to selectively apply a bias voltage to one of the control-gate-lines $CGL_1$-$CGL_2$. By applying bias voltages to selective ones of the word-lines $WL_1$-$WL_2$, the bit-lines $BL_1$-$BL_2$, the source-lines $SL_1$-$SL_2$, and the control-gate-lines $CGL_1$-$CGL_2$, the plurality of FeRAM cells 400a-400d can be operated to store different data states.

FIGS. 5-25 illustrate cross-sectional views 500-2500 of some embodiments of a method of forming an integrated chip having an embedded FeRAM cell. Although FIGS. 5-25 are described in relation to a method, it will be appreciated that the structures disclosed in FIGS. 5-25 are not limited to such a method, but instead may stand alone as structures independent of the method.

As shown in cross-sectional view 500 of FIG. 5, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. The substrate 102 has an embedded memory region 302a and a logic region 302c laterally separated by a boundary region 302b.

A first masking structure 501 is formed over the substrate 102. In some embodiments the first masking structure 501 may comprise a multi-layer masking structure comprising a first masking layer 502 and a second masking layer 504. In some embodiments, the first masking layer 502 may comprise an oxide (e.g., silicon oxide) and the second masking layer 504 may comprise a nitride (e.g., silicon nitride), for example.

As shown in cross-sectional view 600 of FIG. 6, the first masking structure 501 is selectively patterned so that the first masking structure 501 covers the logic region 302c and exposes the embedded memory region 302a. In some embodiments, the first masking structure 501 further covers a part of the boundary region 302b. In some embodiments, the first masking structure 501 is selectively patterned by forming a photoresist layer 604 over the first masking structure 501 and subsequently exposing the first masking structure 501 to a first etchant 602 in areas not covered by the photoresist layer 604. In some embodiments, a resist protective oxide 606 may be deposited over a part of the first masking structure 501 prior to formation of the photoresist layer 604.

As shown in cross-sectional view 700 of FIG. 7, a thermal oxidation process is performed on the substrate 102. The thermal oxidation process forms a thermal oxide 704 on a surface of the substrate 102 not covered by the first masking structure 501. The formation of the thermal oxide 704 consumes a part of the substrate 102 within the embedded memory region 302a, thereby forming a depressed region having a recessed surface 101a of the substrate 102 within the embedded memory region 302a. The recessed surface 101a is depressed below an upper surface 101u of the substrate 102 by a non-zero distance d.

As shown in cross-sectional view 800 of FIG. 8, the thermal oxide (704 of FIG. 7) is removed. Removal of the thermal oxide (704 of FIG. 7) exposes the recessed surface 101a of the substrate 102. Although FIGS. 6-8 recess the embedded memory region 302a of the substrate using a thermal oxidation process, it will be appreciated that in alternative embodiments, the substrate 102 may be recessed within the embedded memory region 302a by selectively etching the substrate 102 in regions not covered by the first masking structure 501.

Figure 9:
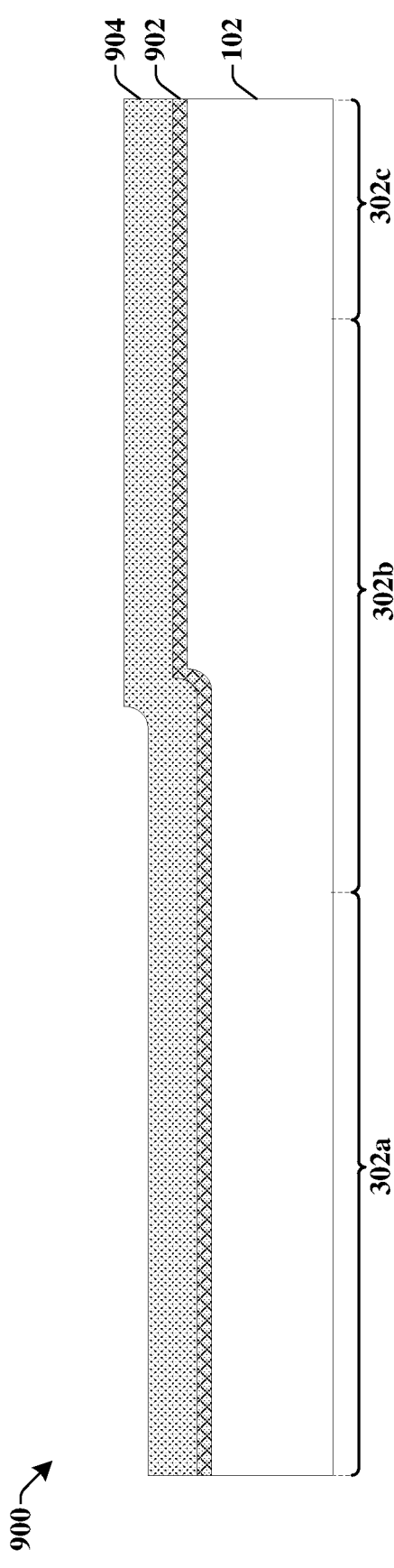

As shown in cross-sectional view 900 of FIG. 9, a pad dielectric layer 902 is formed over the substrate 102 and a first protective layer 904 is formed over the pad dielectric layer 902. In some embodiments, the pad dielectric layer 902 may comprise an oxide formed by a thermal oxidation process. In some embodiments, the first protective layer 904 may comprise a nitride, a carbide, or the like. In some embodiments, the first protective layer 904 may be formed by way of a deposition process (e.g., a physical vapor deposition (PVD) process, a chemical vapor deposition (CVD) process, a plasma enhanced chemical vapor deposition (PE-CVD) process, an atomic layer deposition (ALD) process, or the like).

Figure 10:
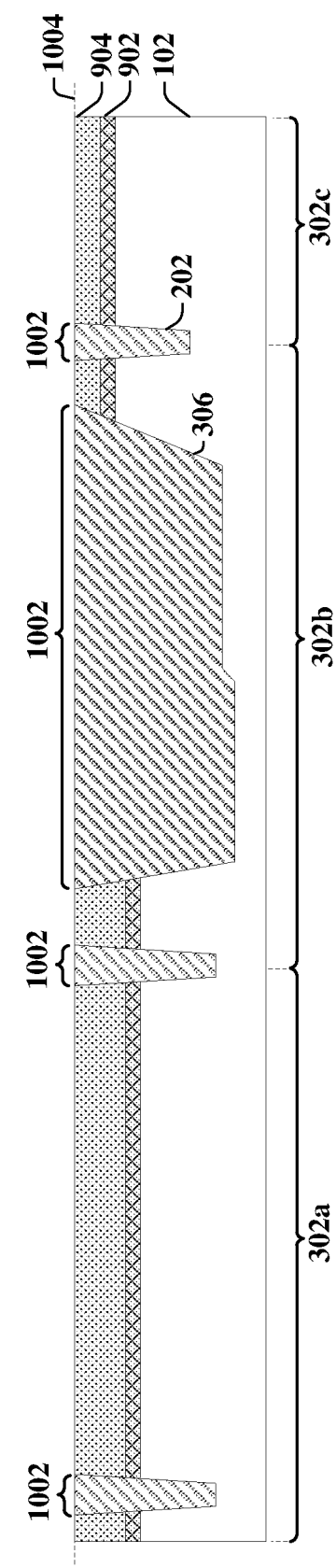

As shown in cross-sectional view 1000 of FIG. 10, a plurality of isolation structures 202 are formed within the embedded memory region 302a and the logic region 302c. A boundary isolation structure 306 is also formed within the boundary region 302b.

In some embodiments, the plurality of isolation structures 202 and the boundary isolation structure 306 may be formed by selectively patterning the pad dielectric layer 902 and the first protective layer 904 to form a plurality of openings extending through the pad dielectric layer 902 and the first protective layer 904. The substrate 102 is subsequently etched according to the plurality of openings to form a plurality of trenches 1002 within the substrate 102. The plurality of trenches 1002 are filled with one or more dielectric materials. In some embodiments, the one or more dielectric materials may be formed by way of a deposition process to fill the plurality of trenches 1002 and to extend over an uppermost surface of the first protective layer 904. A first planarization process (e.g., a chemical mechanical planarization process) may subsequently be performed (along line 1004) to remove the one or more dielectric materials from over an uppermost surface of the first protective layer 904 and to define the plurality of isolation structures 202 and the boundary isolation structure 306. In some embodiments, the one or more dielectric materials may comprise an oxide (e.g., silicon oxide), a nitride, and/or the like.

As shown in cross-sectional view 1100 of FIG. 11, a third masking layer 1102 is formed over the embedded memory region 302a and a part of the boundary region 302b. The isolation structures 202 and a part of the boundary isolation structure 306 not covered by the third masking layer 1102 are subsequently exposed to a second etchant 1104. The second etchant 1104 recesses the isolation structures 202 and the part of the boundary isolation structure 306 not covered by the third masking layer 1102. In some embodiments, the second etchant 1104 gives the boundary isolation structure a first slanted sidewall. The third masking layer 1102 retains the first protective layer 904 in the logic region 302c, so that the first protective layer 904 can be subsequently removed during a separate etch during formation of logic devices in the logic region 302c. This gives more control over formation of the logic devices, thereby increasing logic device compatibility with the embedded memory region 302a.

As shown in cross-sectional view 1200 of FIG. 12, the pad dielectric layer 902 and the first protective layer 904 are removed from within the embedded memory region 302a. In some embodiments, the pad dielectric layer 902 and the first protective layer 904 may be removed by selectively etching the pad dielectric layer 902 and the first protective layer 904 according to the third masking layer (1102 of FIG. 11).

As shown in cross-sectional view 1300 of FIG. 13, an interfacial dielectric layer 120 is formed within the embedded memory region 302a over the substrate 102. In some embodiments, the interfacial dielectric layer 120 may comprise an oxide formed by a thermal oxidation process. In other embodiments, the interfacial dielectric layer 120 may comprise a different dielectric layer (e.g., a nitride and/or a carbide) formed by a deposition process.

An FeRAM stack 1301 is formed over the interfacial dielectric layer 120 within the embedded memory region 302a, the boundary region 302b, and the logic region 302c. The FeRAM stack 1301 comprises a ferroelectric layer 1302 and one or more conductive layers over the ferroelectric layer 1302. In some embodiments, the one or more conductive layers may comprise an etch stop layer 1304 and a conductive electrode layer 1306. In some embodiments, the ferroelectric layer 1302 and the one or more conductive layers may be formed by way of a plurality of separate deposition process (e.g., PVD, CVD, PE-CVD, ALD, or the like).

In various embodiments, the ferroelectric layer 1302 may comprise silicon doped hafnium oxide (Si-doped $HfO_2$), lead titanate, lead zirconate titanate (PZT), lead lanthanum zirconate titanate, strontium bismuth tantalate (SBT), bismuth lanthanum titanate (BLT), bismuth neodymium titanate (BNT), or the like. In some embodiments, the etch stop layer 1304 may comprise aluminum, ruthenium, palladium, hafnium, zirconium, titanium, or the like. In some embodiments, the conductive electrode layer 1306 may comprise, polysilicon or the like.

As shown in cross-sectional view 1400 of FIG. 14, the FeRAM stack (1301 of FIG. 13) is selectively patterned to form a plurality of FeRAM device stacks 1402a-1402b within the embedded memory region 302a. The plurality of FeRAM device stacks 1402a-1402b respectively comprise a ferroelectric material 114, an etch stop layer 208, and a conductive material 210. The FeRAM stack (1301 of FIG. 13) is selectively etched to also form a sacrificial dummy stack 1404 within the boundary region 302b and the logic region 302c. The sacrificial dummy stack 1404 is configured to increase a process window of subsequent planarization processes (e.g., CMP processes) by providing structural support to the planarization process.

In some embodiments, the FeRAM stack (1301 of FIG. 13) may be selectively patterned by forming a hard mask 1405 over the FeRAM stack. The FeRAM stack may subsequently be exposed to a third etchant 1410 that removes the FeRAM stack in areas not covered by the hard mask 1405. In some embodiments, the hard mask 1405 may comprise a multi-layer hard mask having a first hard mask layer 1406 and a second hard mask layer 1408 over the first hard mask layer 1406. In some embodiments, the first hard mask layer 1406 may comprise a dielectric, such as silicon nitride, silicon carbide, or the like. In some embodiments, the second hard mask layer 1408 may comprise silicon oxide or the like.

Figure 15:
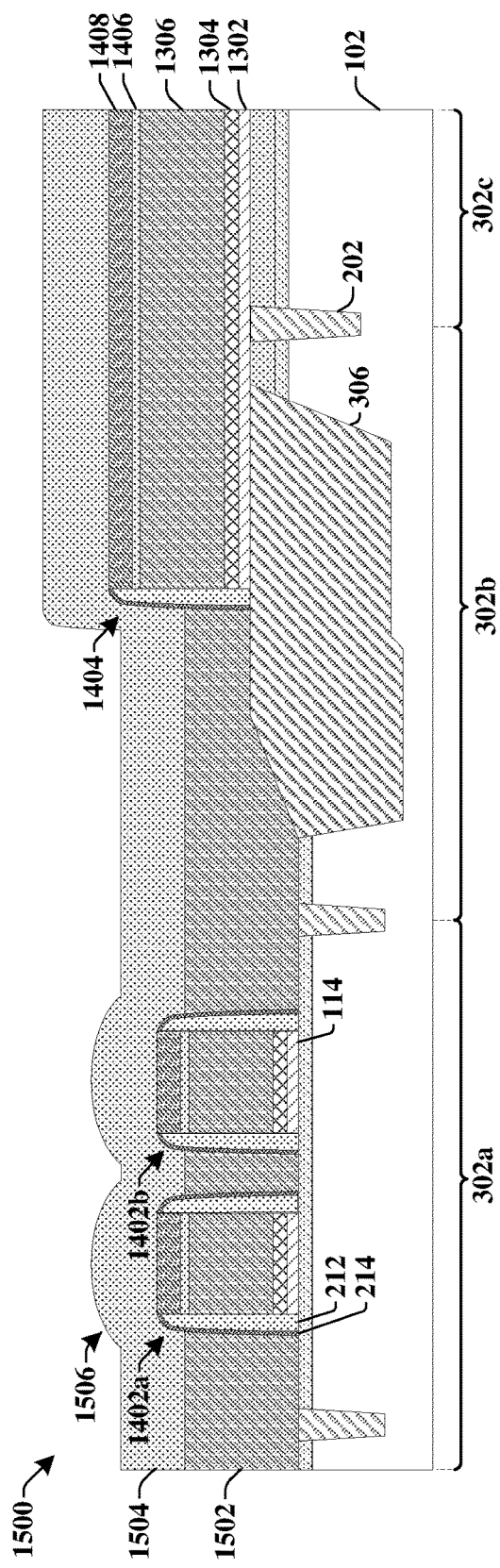

As shown in cross-sectional view 1500 of FIG. 15, a first sidewall spacer material 212 is formed along opposing sidewalls of the plurality of FeRAM device stacks 1402a-1402b. A second sidewall spacer material 214 is subsequently formed along opposing sidewalls of the first sidewall spacer material 212. In some embodiments, the first sidewall spacer material 212 and the second sidewall spacer material 214 may be formed by depositing separate spacer layers onto the plurality of FeRAM device stacks 1402a-1402b. The separate spacer layers are subsequently etched to remove the separate spacer layers from horizontal surfaces, leaving the first sidewall spacer material 212 and the second sidewall spacer material 214 along opposing sides of the plurality of FeRAM device stacks 1402a-1402b. In various embodiments, the separate spacer layers may comprise silicon nitride, a silicon dioxide ($SiO_2$), silicon oxy-nitride (e.g., SiON), or a similar material.

A select gate layer 1502 is formed over the substrate 102 and along sidewalls of the second sidewall spacer material 214. In various embodiments, the select gate layer 1502 may comprise doped polysilicon, a metal, or another conductive material. The select gate layer 1502 may be formed to a height that is less than a height of the plurality of FeRAM device stacks 1402a-1402b. For example, in some embodiments the select gate layer 1502 may be formed using a deposition process (e.g., PVD, CVD, ALD, PE-CVD, or the like) to deposit a select gate material (e.g., doped polysilicon) covering the plurality of FeRAM device stacks 1402a-1402b. The select gate material is subsequently etched back to a height that is less than the select gate layer 1502 (e.g., a height that is in a range of between approximately 50 nm and approximately 150 nm). In some embodiments, a planarization layer (e.g., a bottom layer anti-reflective coating (BARC)) may be formed to cover the select gate material prior to performing the etch back. The planarization layer forms a planar upper surface over the plurality of FeRAM device stacks 1402a-1402b, and causes the resulting select gate layer 1502 to have substantially flat upper surfaces adjacent to the plurality of FeRAM device stacks 1402a-1402b. In some embodiments, the etch back may be performed using a dry etching process.

A hard mask layer 1504 is formed over the select gate layer 1502. The hard mask layer 1504 may be formed by way of a deposition process (e.g., PVD, CVD, ALD, PE-CVD, or the like) to a thickness that is in a range of between approximately 30 nm and approximately 80 nm. In some embodiments, the hard mask layer 1504 comprises protrusions 1506 directly over the plurality of FeRAM device stacks 1402a-1402b. In some embodiments, the hard mask layer 1504 may comprise silicon nitride, silicon carbide, or the like.

Figure 16:
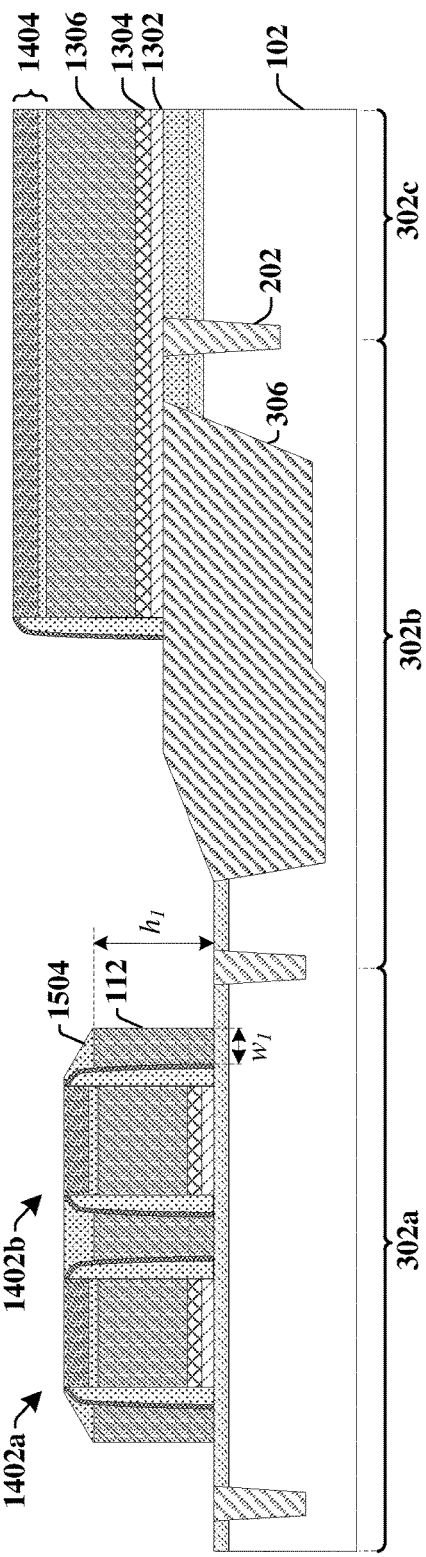

As shown in cross-sectional view 1600 of FIG. 16, the hard mask layer 1504 is selectively patterned and the select gate layer (1502 of FIG. 15) is subsequently patterned according to the hard mask layer 1504 to define select gates 112 arranged along first sides of the FeRAM device stacks 1402a-1402b. In some embodiments, the hard mask layer 1504 and the select gate layer (1502 of FIG. 15) may be patterned by a blanket (e.g., unmasked) etch which removes the select gate layer (1502 of FIG. 15) from areas that are covered by a thinner layer of the hard mask layer 1504. In some embodiments, the select gates 112 may have a height $h_1$ that is in a range of between approximately 50 nm and approximately 150 nm, and a width $w_1$ that is in a range of between approximately between approximately 30 nm and approximately 80 nm. The height of the select gate 112 defines an electrical performance (e.g., a device leakage, on current, or the like) of the select gates 112a.

As shown in cross-sectional views 1700 of FIG. 17, a remainder of the select gate layer (1502 of FIG. 15) is removed between second sides of the FeRAM device stacks 1402a-1402b. In some embodiments, the remainder of the select gate layer (1502 of FIG. 15) may be removed by a photolithography process followed by a selective etching process. For example, a masking layer (e.g., a photoresist layer) may be formed over the substrate 102 and have sidewalls that define an opening that is directly over the select gate layer (1502 of FIG. 15) between the second sides of the FeRAM device stacks 1402a-1402b. The select gate layer (1502 of FIG. 15) is subsequently exposed to an etchant according to the opening in the masking layer to remove the remainder of the select gate layer (1502 of FIG. 15). After the etching process is completed the masking layer may be removed.

After removing the remainder of the select gate layer (1502 of FIG. 15), a common source region 108 is formed within the substrate 102 between the second sides of the FeRAM device stacks 1402a-1402b. In some embodiments, the common source region 108 is formed by selectively implanting a dopant species into the substrate 102.

A lower dummy memory layer 312 is formed over the substrate 102. The lower dummy memory layer 312 continuously extends over the FeRAM device stacks 1402a-1402b and the sacrificial dummy stack 1404. In some embodiments, the lower dummy memory layer 312 may comprise an oxide, such as silicon dioxide, for example. In other embodiments, the lower dummy memory layer 312 may comprise polysilicon.

A fourth masking layer 1702 is formed over the substrate 102. The fourth masking layer 1702 covers the embedded memory region 302a, the boundary region 302b, and the logic region 302c. In some embodiments, fourth masking layer 1702 may have an upper surface with a curve between a first height over the embedded memory region 302a and a second height over the logic region 302c. In some embodiments, the fourth masking layer 1702 may comprise a polysilicon layer.

As shown in cross-sectional views 1800 of FIG. 18, a planarization process is performed on the fourth masking layer 1702. The planarization process is performed along line 1802, so as to form a planar surface extending from over the embedded memory region 302a to over the logic region 302c. In some embodiments, the planarization process may comprise a CMP process.

As shown in cross-sectional views 1900 of FIG. 19, the fourth masking layer 1702 is selectively etched to remove the fourth masking layer 1702 from within the logic region 302c and a part of the boundary region 302b. The boundary isolation structure 306 is subsequently etched to form a second slanted sidewall 306b. The first slanted sidewall and the second slanted sidewall define a hillock 306h along a top of the boundary isolation structure 306.

In some embodiments, the fourth masking layer 1702 and the boundary isolation structure 306 may be selectively exposed to one or more etchants 1902 according to a fifth masking layer 1904 formed over the embedded memory region 302a and a part of the boundary region 302b. In some embodiments, the fourth masking layer 1702 and the boundary isolation structure 306 may be selectively etched using a same etchant. In other embodiments, the fourth masking layer 1702 may be selectively etched using a fourth etchant and the boundary isolation structure 306 may be selectively etched using a fifth etchant that is different than the fourth etchant. For example, in some embodiments, fourth masking layer 1702 may be selectively etched using an etchant comprising phosphoric acid ($HP_3O_4$) or the like. The boundary isolation structure 306 may be subsequently etched using a wet etchant comprising hydrofluoric acid (HF) or the like.

In some embodiments, the one or more etchants 1902 may also remove the sacrificial dummy stack (1404 of FIG. 18), the first masking layer (502 of FIG. 18), and the second masking layer (504 of FIG. 18). In some embodiments, an interfacial dielectric layer 332 may be formed over the substrate 102 within the logic region 302c after removal of the first masking layer 502 and the second masking layer 504. In some embodiments, the interfacial dielectric layer 332 may comprise an oxide (e.g., silicon oxide or the like). In some embodiments, the interfacial dielectric layer 332 within the logic region 302c may have a different thickness than an interfacial dielectric layer (120 of FIG. 13) within the embedded memory region 302a. In some embodiments, a well region 330 may also be formed within the substrate 102 in the logic region 302c after removal of the first masking layer 502 and the second masking layer 504.

As shown in cross-sectional views 2000 of FIG. 20, a sacrificial gate stack 2002 is formed over the substrate 102. The sacrificial gate stack 2002 continuously extends from within the logic region 302c to over the fourth masking layer 1702 within the embedded memory region 302a. In some embodiments, the sacrificial gate stack 2002 may comprise a gate dielectric layer 316, a sacrificial gate electrode layer 2004, and a hard mask 2006. In some embodiments, an etch stop layer 320 may be arranged between the gate dielectric layer 316 and the sacrificial gate electrode layer 2004. In some embodiments, the sacrificial gate electrode layer 2004 may comprise polysilicon. In some embodiments, the hard mask 2006 may comprise a multi-layer hard mask having a first hard mask layer 2008 (e.g., SiN) and a second hard mask layer 2010 (e.g., silicon oxide) over the first hard mask layer 2008.

In some embodiments, the gate dielectric layer 316 may comprise a high-k dielectric, such as, aluminum oxide, hafnium oxide, or the like. In some embodiments, the etch stop layer 320 may comprise tantalum nitride, or the like. In some embodiments, the first hard mask layer 2008 may comprise a dielectric, such as silicon nitride, silicon carbide, or the like. In some embodiments, the second hard mask layer 2010 may comprise silicon oxide or the like.

Figure 21:
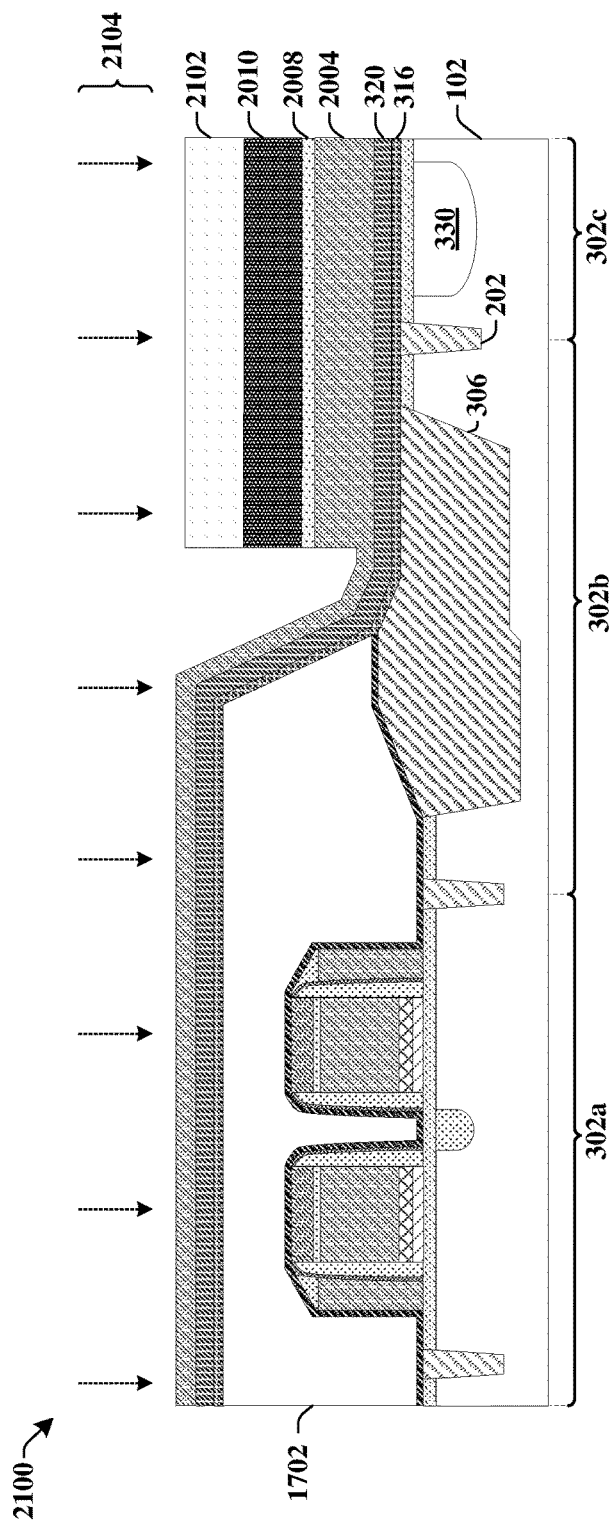

As shown in cross-sectional view 2100 of FIG. 21, a thickness of the sacrificial gate electrode layer 2004 is reduced within the embedded memory region 302a and within a part of the boundary region 302b. In some embodiments, the thickness of the sacrificial gate electrode layer 2004 may be reduced by between approximately 50% and approximately 75%. In some embodiments, the thickness of the sacrificial gate electrode layer 2004 is reduced by forming a sixth masking layer 2102 over the hard mask 2006 within the logic region 302c and a part of the boundary region 302b. The hard mask 2006 and the sacrificial gate electrode layer 2004 are subsequently exposed to a sixth etchant 2104 in areas not covered by the sixth masking layer 2102.

Figure 22:
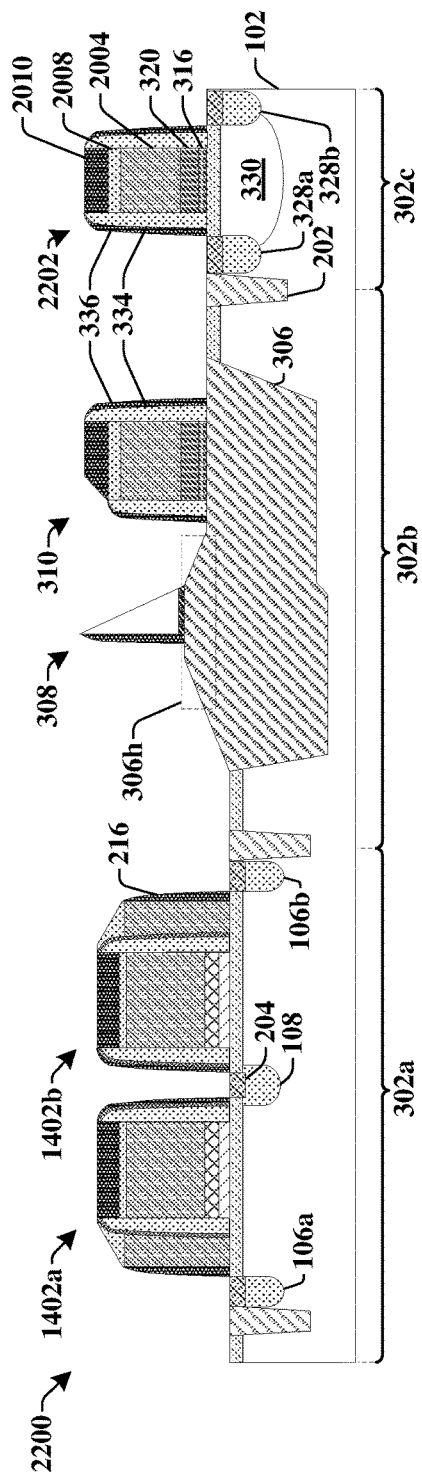

As shown in cross-sectional view 2200 of FIG. 22, the sacrificial gate stack 2002 is patterned according to a patterning process to define a dummy gate structure 2202 within the logic region 302c and to define a dummy logic structure 310 over the boundary isolation structure. In some embodiments, the patterning process will vertically and laterally etch the second hard mask layer 2010. In some such embodiments, the proximity of the dummy logic structure 310 to an edge of the second hard mask layer 2010 will cause the second hard mask layer 2010 that remains along a top of the dummy logic structure 310 (after the patterning process) to have outer sidewalls oriented at different angles. The fourth masking layer (1702 of FIG. 21) is also etched to define dummy memory structure 308 over the hillock 306h in the boundary isolation structure 306.

In some embodiments, a first logic sidewall spacer material 334 may be formed along sidewalls of the sacrificial gate stack 2002 and the dummy memory structure 308. A third sidewall spacer material 216 may also be formed along sidewalls of the FeRAM device stacks 1402a-1402b, and a second logic sidewall spacer material 336 may be formed along sidewalls of the sacrificial gate stack 2002, the dummy memory structure 308, the dummy logic structure 310, and the select gate 112. In some embodiments, the first logic sidewall spacer material 334, the second logic sidewall spacer material 336, and the third sidewall spacer material 216 may be formed by depositing one or more dielectric materials over the substrate 102 and subsequently etching the one or more dielectric materials to remove the one or more dielectric materials from horizontal surfaces. In some embodiments, etching the one or more dielectric materials may also remove the one or more dielectric materials from a sidewall of the second hard mask layer 2010 facing the FeRAM device stacks 1402a-1402b. In some such embodiments, the first logic sidewall spacer material 334 and/or the second logic sidewall spacer material 336 have different heights along opposing sidewalls of the dummy memory structure 308. In some embodiments, the one or more dielectric materials may comprise an oxide, a nitride, a carbide, or the like.

Drain regions 106a-106b are formed within the embedded memory region 302a and a second source region 328a and a second drain region 328b are formed within the logic region 302c. In some embodiments, the drain regions 106a-106b are formed by way of a first implantation process, while the second source region 328a and the second drain region 328b are formed by way of a second implantation process. In some embodiments, the first and second implantation processes are a same implantation process. In some embodiments, the drain regions 106a-106b have a same doping type as the common source region 108, while the second source region 328a and the second drain region 328b have an opposite doping type as the well region 330.

A silicidation process is performed to form a silicide layer 204 along upper surfaces of the drain regions 106a-106b, the common source region 108, the second source region 328a, and the second drain region 328b. In some embodiments, the silicidation process may also form a silicide on the conductive electrode 116 and/or the select gate 112. In some embodiments, the silicidation process may be performed by depositing a metal layer (e.g., a nickel layer) and then performing a thermal annealing process (e.g., a rapid thermal anneal) to form the silicide layer 204.

As shown in cross-sectional view 2300 of FIG. 23, a first inter-level dielectric (ILD) layer 122a is formed over the substrate 102. The first ILD layer 122a laterally surrounds the plurality of FeRAM device stacks (1402a-1402b of FIG. 22), the dummy memory structure 308, the dummy logic structure 310, and the dummy gate structure 2202. In various embodiments, the first ILD layer 122a may be deposited onto the substrate 102 by a chemical vapor deposition (CVD) process using high aspect ratio process (i.e., a HARP oxide). For example, in some embodiments, the first ILD layer 122a may comprise an oxide or boron-phosphor-silicate glass deposited by a CVD process. After formation of the first ILD layer 122a, a fourth planarization process may be performed along line 2302 to expose upper surfaces of the dummy gate structure 2202 within the logic region 302c and to define FeRAM cells 104a-104b within the embedded memory region 302a.

As shown in cross-sectional view 2400 of FIG. 24, the sacrificial gate electrode layer (2004 of FIG. 23) is removed from the dummy gate structure (2202 of FIG. 23) to define a gate electrode cavity 2402. In some embodiments, the sacrificial gate electrode layer (2004 of FIG. 23) may be removed by selectively exposing the sacrificial gate electrode layer (2004 of FIG. 23) to a seventh etchant 2404.

Figure 25:
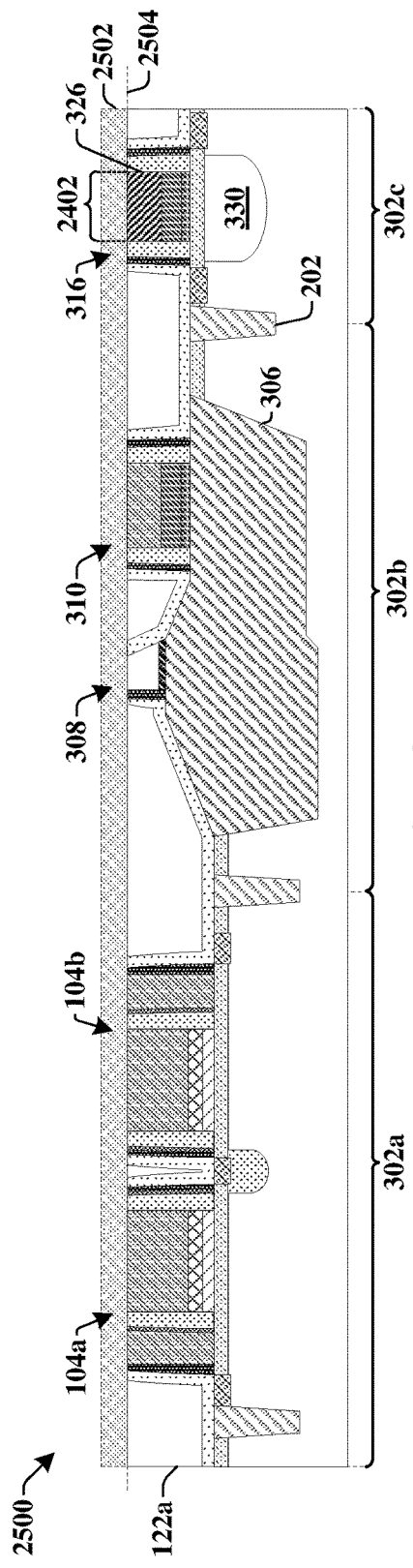

As shown in cross-sectional view 2500 of FIG. 25, a gate electrode 326 is formed within the gate electrode cavity 2402. In some embodiments, the gate electrode 326 may be formed by forming one or more metal gate materials 2502 within the gate electrode cavity 2402 and over the first ILD layer 122a. In some embodiments, the one or more metal gate materials 2502 may be formed using a deposition process (e.g., PVD, CVD, ALD, PE-CVD, or the like). A fifth planarization process is subsequently performed along line 2504. The fifth planarization process removes a part of the one or more metal gate materials 2502 from over the first ILD layer 122a to define a gate electrode 326. In some embodiments, the one or more metal gate materials 2502 may comprise an n-type gate metal such as aluminum, tantalum, titanium, hafnium, zirconium, titanium silicide, tantalum nitride, tantalum silicon nitride, chromium, tungsten, cooper, titanium aluminum, or the like. In other embodiments, the one or more metal gate materials 2502 may comprise a p-type gate metal such as nickel, cobalt, molybdenum, platinum, lead, gold, tantalum nitride, molybdenum silicide, ruthenium, chromium, tungsten, copper, or the like.

Figure 26:
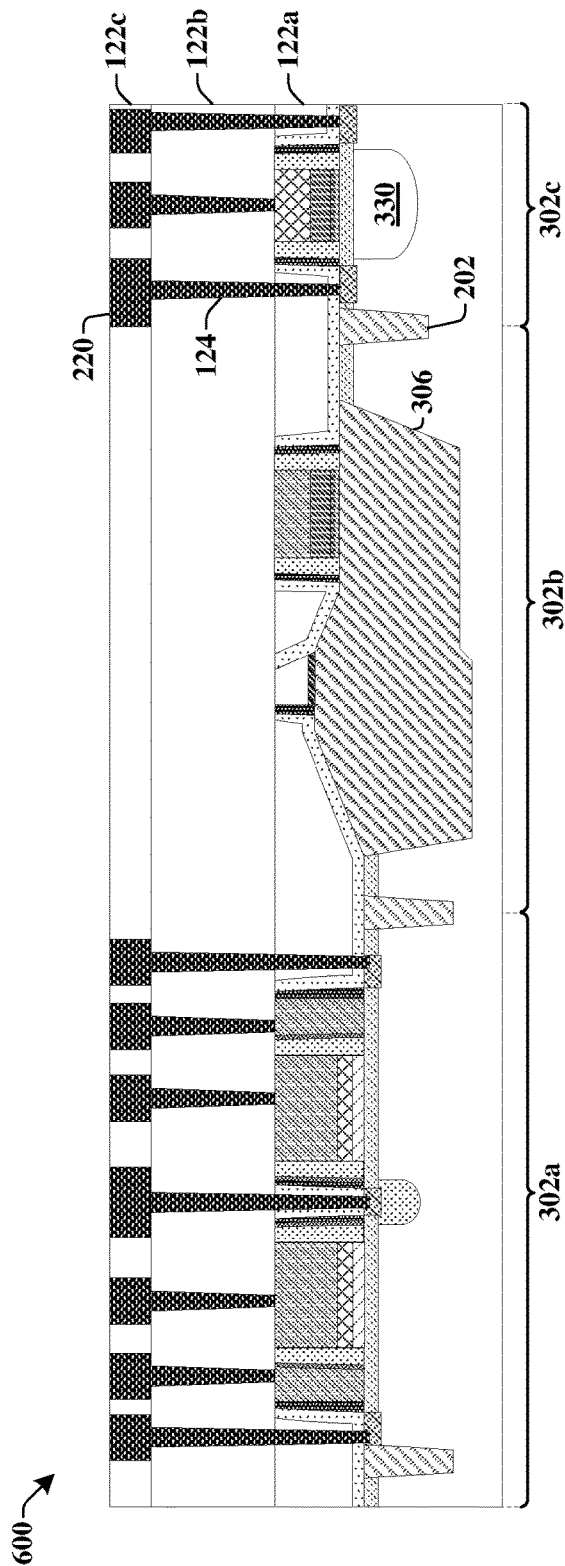

As shown in cross-sectional view 2600 of FIG. 26, conductive contacts 124 are formed within a second ILD layer 122b overlying the first ILD layer 122a. Conductive interconnect wires are also formed within an IMD layer 122c overlying the second ILD layer 122b.

In some embodiments, the conductive contacts 124 and/or the conductive interconnect wires 220 may be formed using a damascene process. For example, in some embodiments, the conductive contacts 124 may be formed by forming the second ILD layer 122b over the first ILD layer 122a, selectively etching the second ILD layer 122b to form via holes, and subsequently depositing a first conductive material within the via holes. In some embodiments, the first conductive material may comprise tungsten (W) or titanium nitride (TiN), for example. Similarly, in some embodiments, the conductive interconnect wires 220 may be formed by forming an IMD layer 122c over the second ILD layer 122b, selectively etching IMD layer 122c to form trenches, and subsequently depositing a second conductive material within the trenches. In some embodiments, the second conductive material may comprise copper (Cu) and/or aluminum (Al), for example.

Figure 27:
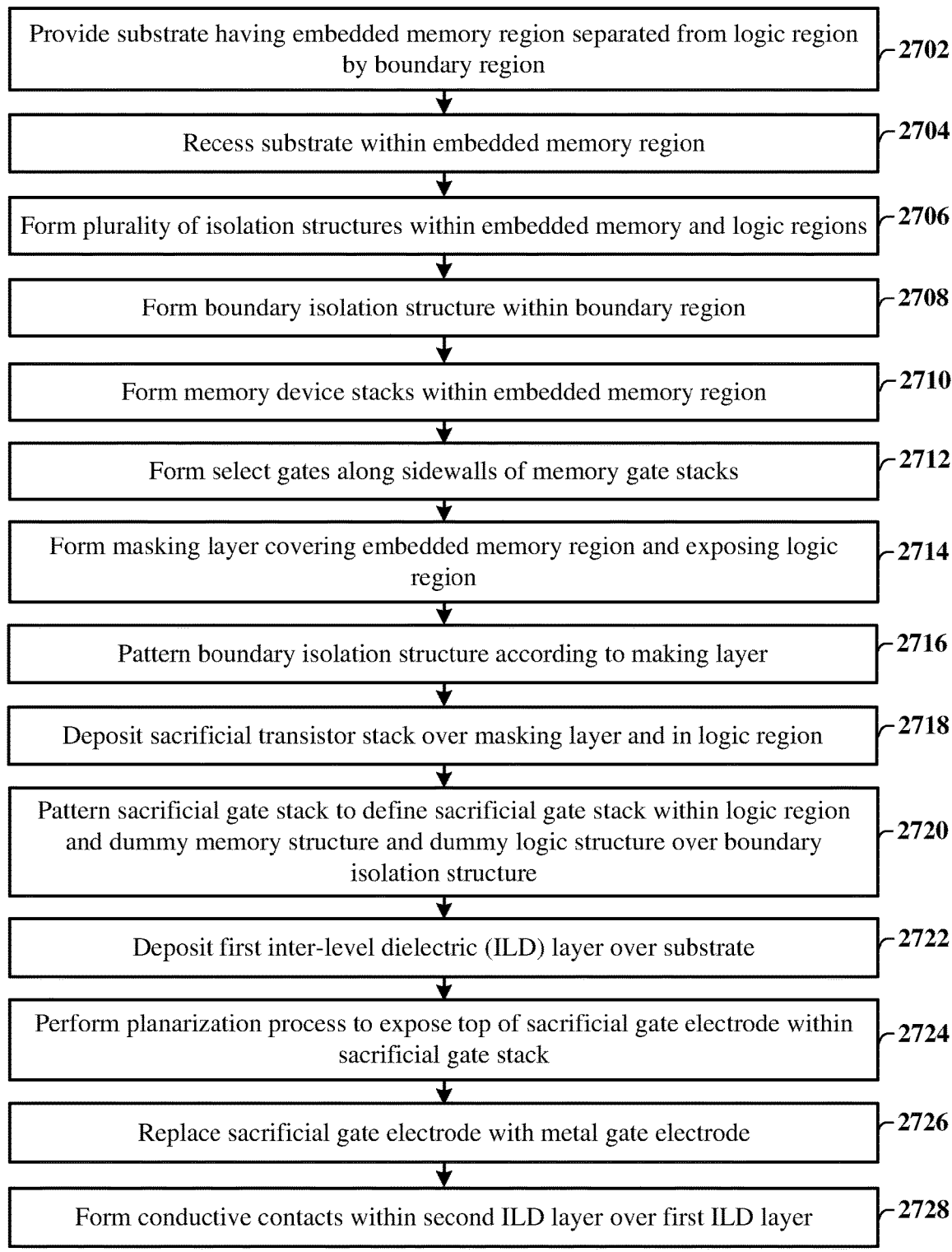
FIG. 27 illustrates a flow diagram of some embodiments of a method of forming an integrated chip having an embedded FeRAM cell.

FIG. 27 illustrates a flow diagram of some embodiments of a method 2700 of forming an integrated chip having an embedded FeRAM cell.

While method 2700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2702, a substrate is provided. The substrate has an embedded memory region separated from a logic region by a boundary region. FIG. 5 illustrates a cross-sectional view 500 of some embodiments corresponding to act 2702.

At 2704, the substrate is recessed within the embedded memory region. FIGS. 6-8 illustrate cross-sectional views 600-800 of some embodiments corresponding to act 2704.

At 2706, a plurality of isolation structures are formed within the embedded memory region and the logic region. FIGS. 9-12 illustrate cross-sectional views 900-1200 of some embodiments corresponding to act 2706.

At 2708, a boundary isolation structure is formed within the boundary region. FIGS. 9-12 illustrate cross-sectional views 900-1200 of some embodiments corresponding to act 2708.

At 2710, a plurality of memory device stacks are formed within the embedded memory region. FIGS. 13-14 illustrate cross-sectional views 1300-1400 of some embodiments corresponding to act 2710.

At 2712, select gates are formed along sidewalls of the memory device stacks. FIGS. 15-16 illustrate cross-sectional views 1500-1600 of some embodiments corresponding to act 2712.

At 2714, a masking layer is formed over the embedded memory region. The masking layer exposes the logic region and a part of the embedded memory region. FIGS. 17-18 illustrate cross-sectional views 1700-1800 of some embodiments corresponding to act 2714.

At 2716, the boundary isolation structure is patterned according to the masking layer. FIG. 19 illustrates a cross-sectional view 1900 of some embodiments corresponding to act 2716.

At 2718, a sacrificial transistor stack is formed over the masking layer and within the logic region. The sacrificial transistor stack comprises a sacrificial gate electrode. FIGS. 20-22 illustrate cross-sectional views 2000-2200 of some embodiments corresponding to act 2718.

At 2720, the sacrificial gate stack is patterned to define a sacrificial transistor stack within the logic region and a dummy memory structure and a dummy logic structure over the boundary isolation structure. FIGS. 20-22 illustrate cross-sectional views 2000-2200 of some embodiments corresponding to act 2720.

At 2722, a first inter-level dielectric (ILD) layer is deposited over the substrate. FIG. 23 illustrates a cross-sectional view 2300 of some embodiments corresponding to act 2722.

At 2724, a planarization process is performed to expose a top of a sacrificial gate electrode within the sacrificial gate stack. FIG. 23 illustrates a cross-sectional view 2300 of some embodiments corresponding to act 2724.

At 2726, the sacrificial gate electrode is replaced with a metal gate. FIGS. 24-25 illustrate cross-sectional views 2400-2500 of some embodiments corresponding to act 2726.

At 2728, conductive contacts are formed within a second ILD layer over the substrate. FIG. 26 illustrates a cross-sectional view 2600 of some embodiments corresponding to act 2728.

Accordingly, in some embodiments, the present disclosure relates to an integrated chip having an embedded FeRAM cell comprising a select gate configured to selectively provide access to an FeRAM device. The select gate provides for a relatively low current in channel regions of unselected FeRAM cells, thereby improving the power consumption and/or read operations of an FeRAM array.

In some embodiments, the present disclosure relates to a memory structure. The memory structure includes a source region and a drain region disposed within a substrate; a select gate disposed over the substrate between the source region and the drain region; and a ferroelectric random access memory (FeRAM) device disposed over the substrate between the select gate and the source region, the FeRAM device including a ferroelectric material arranged between the substrate and a conductive electrode. In some embodiments, the select gate and the conductive electrode include polysilicon. In some embodiments, the conductive electrode has an etch stop layer contacting an upper surface of the ferroelectric material. In some embodiments, the memory structure further includes a sidewall spacer arranged between the select gate and the FeRAM device. In some embodiments, the sidewall spacer includes a dielectric material that continuously extends to directly contact and completely cover a sidewall of the conductive electrode and a sidewall of the ferroelectric material. In some embodiments, the memory structure further includes an interfacial dielectric layer continuously extending from between the select gate and the substrate to between the ferroelectric material and the substrate. In some embodiments, the interfacial dielectric layer has a first thickness directly below the ferroelectric material and a second thickness directly below the select gate; the first thickness is different than the second thickness. In some embodiments, the memory structure further includes an inter-level dielectric (ILD) layer arranged over the substrate; a first conductive contact extending from a top of the ILD layer to the select gate; and a second conductive contact extending from the top of the ILD layer to the conductive electrode. In some embodiments, the substrate has a recessed surface extending between a first sidewall and a second sidewall of the substrate to define a depressed region within an upper surface of the substrate; the FeRAM device is arranged over the recessed surface and directly between the first sidewall and the second sidewall. In some embodiments, the memory structure further includes a word-line decoder coupled to the select gate by a word-line; and a control gate decoder coupled to the conductive electrode by a control-gate-line extending in parallel to the word-line.

In other embodiments, the present disclosure relates to an integrated chip. The integrated chip includes a common source region disposed within a recessed surface of a substrate between a first drain region and a second drain region, the recessed surface is recessed below an upper surface of the substrate by a non-zero distance; a boundary isolation structure arranged laterally between the recessed surface and the upper surface; a first ferroelectric random access memory (FeRAM) cell having a first select gate disposed over the recessed surface between the common source region and the first drain region and a first FeRAM device disposed over the recessed surface between the first select gate and the common source region; and a second FeRAM cell having a second select gate disposed over the recessed surface between the common source region and the second drain region and a second FeRAM device disposed over the recessed surface between the second select gate and the common source region. In some embodiments, the first FeRAM device includes a conductive material separated from a ferroelectric material by an etch stop layer. In some embodiments, the first FeRAM device and the first select gate include a same material. In some embodiments, the first FeRAM device includes a ferroelectric material and a conductive electrode disposed over the ferroelectric material. In some embodiments, the first select gate is coupled to a word-line and the conductive electrode is coupled to a control-gate line that is configured to be biased independently from the word-line. In some embodiments, the integrated chip further includes a sidewall spacer laterally disposed between the first select gate and the first FeRAM device. In some embodiments, the sidewall spacer includes a first sidewall spacer material directly contacting the ferroelectric material and the conductive electrode; and a second sidewall spacer material directly contacting the first select gate, the first sidewall spacer material and the second sidewall spacer material having substantially equal heights. In some embodiments, the sidewall spacer extends from a first horizontal plane extending along a bottom of the first FeRAM device to a second horizontal plane extending along a top of the first FeRAM device.

In yet other embodiments, the present disclosure relates to a method of forming a memory structure. The method includes forming an interfacial dielectric layer over a substrate; depositing a ferroelectric random access memory (FeRAM) stack over the interfacial dielectric layer, the FeRAM stack having a ferroelectric layer and one or more conductive layers over the ferroelectric layer; patterning the FeRAM stack to define an FeRAM device stack; forming a select gate layer laterally surrounding the FeRAM device stack; patterning the select gate layer to define a select gate along a second side of the FeRAM device stack; forming a common source region within the substrate along a first side of the FeRAM device stack; and forming a drain region within the substrate, wherein the drain region is separated from the FeRAM device stack by the select gate. In some embodiments, the method further includes recessing a part of the substrate to form a recessed surface of the substrate that is depressed below an upper surface of the substrate, the FeRAM device stack and the select gate are formed directly over the recessed surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip structure, comprising:
   a source region, a first drain region, and a second drain region disposed within a substrate;
   a first select gate disposed over the substrate between the source region and the first drain region;
   a first ferroelectric random access memory (FeRAM) device disposed over the substrate between the first select gate and the source region;
   a second select gate disposed over the substrate between the source region and the second drain region; and
   a second FeRAM device disposed over the substrate between the second select gate and the source region, wherein the second FeRAM device is a closest neighboring device to the first FeRAM device.

2. The integrated chip structure of claim 1, further comprising:

a first sidewall spacer arranged along a first side of the first FeRAM device, the first side of the first FeRAM device facing the second FeRAM device; and a second sidewall spacer arranged along a second side of the second FeRAM device, the second side of the second FeRAM device facing the first FeRAM device.

3. The integrated chip structure of claim 2, further comprising:

an etch stop layer arranged along sidewalls of the first sidewall spacer and the second sidewall spacer, wherein the etch stop layer has a vertically extending sidewall that protrudes outward from an upper surface of the etch stop layer and that is directly over is over a part of the source region.

4. The integrated chip structure of claim 1, wherein the first FeRAM device comprises a conductive electrode that includes polysilicon and titanium nitride.

5. The integrated chip structure of claim 1, wherein the first select gate has a curved sidewall facing the first FeRAM device.

6. The integrated chip structure of claim 1, wherein the first FeRAM device comprises a ferroelectric material arranged between the substrate and a conductive electrode; and wherein the first select gate and the conductive electrode comprise polysilicon, the polysilicon of the first select gate vertically extending below a bottom of the polysilicon within the conductive electrode.

7. An integrated chip structure, comprising:

a source region, a first drain region, and a second drain region disposed within a substrate;

a first select gate disposed over the substrate between the source region and the first drain region;

a first ferroelectric random access memory (FeRAM) device disposed over the substrate between the first select gate and the source region;

a second select gate disposed over the substrate between the source region and the second drain region;

a second FeRAM device disposed over the substrate between the second select gate and the source region, wherein the second FeRAM device is a closest neighboring device to the first FeRAM device;

a transistor device disposed on an upper surface of the substrate; and wherein the substrate has a recessed surface that is below the upper surface of the substrate and that is laterally separated from the upper surface of the substrate by a boundary isolation structure extending into a trench within the upper surface of the substrate, the first FeRAM device and the second FeRAM device being arranged over the recessed surface.

8. The integrated chip structure of claim 7, further comprising:

a dielectric laterally surrounding the first FeRAM device, the second FeRAM device, and the transistor device, wherein the first FeRAM device, the second FeRAM device, and the transistor device extend to a top surface of the dielectric.

9. The integrated chip structure of claim 7, further comprising:

a dielectric laterally surrounding the first FeRAM device and the second FeRAM device, wherein the first FeRAM device and the second FeRAM device vertically extend to a top of the dielectric.

10. The integrated chip structure of claim 7, wherein the first FeRAM device has a larger height than the transistor device.

11. The integrated chip structure of claim 7, wherein the first select gate has a width that varies over a height of the first select gate.

12. The integrated chip structure of claim 7, wherein the boundary isolation structure has a first upper surface and a second upper surface that is vertically above the first upper surface.

13. The integrated chip structure of claim 12, further comprising:

a first dummy structure arranged over the second upper surface of the boundary isolation structure, wherein the first dummy structure has a bottom surface having a first width and a top surface having a second width that is smaller than the first width.

14. The integrated chip structure of claim 13, further comprising:

a second dummy structure arranged over the first upper surface of the boundary isolation structure, wherein the second dummy structure is a same material as a conductive electrode of the first FeRAM device.

15. An integrated chip structure, comprising:

a source region, a first drain region, and a second drain region disposed within a substrate;

a first select gate disposed over the substrate between the source region and the first drain region;

a first ferroelectric random access memory (FeRAM) device disposed over the substrate between the first select gate and the source region;

a second select gate disposed over the substrate between the source region and the second drain region;

a second FeRAM device disposed over the substrate between the second select gate and the source region, wherein the second FeRAM device is a closest neighboring device to the first FeRAM device; and an interfacial dielectric layer continuously extending from directly between the first FeRAM device and the substrate to directly between the second FeRAM device and the substrate.

16. The integrated chip structure of claim 15, wherein the first FeRAM device comprises a ferroelectric material arranged between the substrate and a polysilicon electrode.

17. The integrated chip structure of claim 15, wherein the first FeRAM device has a larger width than the first select gate, as viewed in a cross-sectional view.

18. The integrated chip structure of claim 15, further comprising:

a sidewall spacer arranged along a sidewall of the first select gate, wherein the sidewall spacer completely covers the sidewall of the first select gate.

19. The integrated chip structure of claim 15, wherein the first FeRAM device comprises a ferroelectric material arranged between the substrate and a conductive electrode, the first select gate comprising a bottommost surface that is vertically below a bottommost surface of the conductive electrode.

20. The integrated chip structure of claim 15, further comprising:

an inter-level dielectric (ILD) layer laterally surrounding the first FeRAM device and the second FeRAM device, wherein the ILD layer is vertically above a top of the interfacial dielectric layer.

* * * * *